US011616118B2

(12) United States Patent
Kim et al.

(10) Patent No.: US 11,616,118 B2
(45) Date of Patent: Mar. 28, 2023

(54) INTEGRATED CIRCUIT SEMICONDUCTOR DEVICE

(71) Applicant: Samsung Electronics Co., Ltd., Suwon-si (KR)

(72) Inventors: Seungjin Kim, Hwaseong-si (KR); Sungsoo Yim, Seoul (KR); Suklae Kim, Seoul (KR); Hyukwoo Kwon, Seoul (KR); Byunghyun Lee, Hwaseong-si (KR); Yoonyoung Choi, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 145 days.

(21) Appl. No.: 16/938,286

(22) Filed: Jul. 24, 2020

(65) Prior Publication Data

US 2021/0134942 A1 May 6, 2021

(30) Foreign Application Priority Data

Oct. 31, 2019 (KR) .......................... 10-2019-0138200

(51) Int. Cl.
*H01L 49/02* (2006.01)
*H01L 27/108* (2006.01)

(52) U.S. Cl.
CPC ........ *H01L 28/60* (2013.01); *H01L 27/10814* (2013.01)

(58) Field of Classification Search
CPC ......... H01L 27/10852; H01L 28/90–92; H01L 27/10808; H01L 27/10814; H01L 27/10811
See application file for complete search history.

(56) References Cited

U.S. PATENT DOCUMENTS

| 6,700,153 B2* | 3/2004 | Oh .......................... H01L 28/91 257/303 |
| 7,338,878 B2* | 3/2008 | Ikeda ................ H01L 27/10852 438/386 |
| 8,969,167 B2 | 3/2015 | Yoon et al. |
| 9,142,558 B2 | 9/2015 | Yang et al. |
| 9,159,729 B2 | 10/2015 | Kim et al. |
| 9,240,441 B2 | 1/2016 | Yoon et al. |

(Continued)

FOREIGN PATENT DOCUMENTS

| KR | 10-2009-0016815 A | 2/2009 |
| KR | 101934093 B1 | 1/2019 |
| KR | 101944479 B1 | 1/2019 |

OTHER PUBLICATIONS

DE Office Action dated Oct. 27, 2022 for corresponding DE Patent Application No. 102020115742.8.

*Primary Examiner* — John A Bodnar

(74) *Attorney, Agent, or Firm* — Harness, Dickey & Pierce, P.L.C.

(57) ABSTRACT

An integrated circuit semiconductor device includes a plurality of cylindrical structures separated from each other on a substrate; and a plurality of supporters having an opening region exposing side surfaces of the plurality of cylindrical structures, the plurality of supporters being in contact with the side surfaces of the plurality of cylindrical structures and supporting the plurality of cylindrical structures, wherein each of the plurality of supporters has both side surfaces having slopes and has a top width that is less than a bottom width.

20 Claims, 22 Drawing Sheets

(56) References Cited

U.S. PATENT DOCUMENTS

| | | |
|---|---|---|
| 9,263,536 B2 | 2/2016 | Kim et al. |
| 9,985,033 B2 | 5/2018 | Park et al. |
| 10,304,838 B2 | 5/2019 | Kim et al. |
| 2006/0211178 A1 | 9/2006 | Kim et al. |
| 2009/0121315 A1* | 5/2009 | Baars ................ H01L 28/90 257/532 |
| 2010/0177459 A1* | 7/2010 | Wu ................ H01L 28/92 257/296 |
| 2010/0314674 A1* | 12/2010 | Etou ................ H01L 27/10894 257/296 |
| 2013/0161787 A1 | 6/2013 | Kim et al. |
| 2014/0159252 A1 | 6/2014 | Han et al. |
| 2016/0064386 A1 | 3/2016 | Park et al. |
| 2018/0301457 A1* | 10/2018 | Lee ................ H01L 28/91 |

\* cited by examiner

INTEGRATED CIRCUIT SEMICONDUCTOR DEVICE

CROSS-REFERENCE TO RELATED APPLICATION

This application claims the benefit of Korean Patent Application No. 10-2019-0138200, filed on Oct. 31, 2019, in the Korean Intellectual Property Office, the disclosure of which is incorporated herein in its entirety by reference.

BACKGROUND

The inventive concepts relate to an integrated circuit semiconductor device, and more particularly, to an integrated circuit semiconductor device including cylindrical structures.

As for integrated circuit semiconductor devices, e.g., dynamic random access memory (DRAM) devices, when an integration density increases, the area of a device decreases, but capacitance needs to be maintained or increased. Accordingly, lower electrodes of a capacitor are formed as three-dimensional cylindrical structures.

The aspect ratio of cylindrical structures, e.g., cylindrical lower electrodes, is increasing according to desired capacitance. Accordingly, a bridge phenomenon, in which cylindrical structures stick to each other, easily occurs, and therefore, it is not easy to form cylindrical structures. In addition, cylindrical structures may collapse or break before a subsequent process, e.g., a process of forming a dielectric layer.

SUMMARY

The inventive concepts provide an integrated circuit semiconductor device including cylindrical structures, e.g., cylindrical lower electrodes, which are stably arranged without sticking to each other and collapsing or breaking.

According to an aspect of the inventive concepts, there is provided an integrated circuit semiconductor device including a plurality of cylindrical structures separated from each other on a substrate; and a plurality of supporters having an opening region exposing side surfaces of the plurality of cylindrical structures, the plurality of supporters being in contact with the side surfaces of the plurality of cylindrical structures and supporting the plurality of cylindrical structures, wherein each of the plurality of supporters has both side surfaces having slopes and has a top width that is less than a bottom width.

According to another aspect of the inventive concepts, there is provided an integrated circuit semiconductor device including a plurality of cylindrical structures separated from each other on a substrate; and a plurality of supporters having an opening region exposing side surfaces of the plurality of cylindrical structures, the plurality of supporters being in contact with the side surfaces of the plurality of cylindrical structures, being at a height that is lower than top surfaces of the plurality of cylindrical structures, and supporting the plurality of cylindrical structures.

The plurality of cylindrical structures include a first level electrode portion, a second level electrode portion, and a third level electrode portion, the first level electrode portion having a first height from the substrate, the second level electrode portion having a second height from a top of the first level electrode portion, and the third level electrode portion having a third height from a top of the second level electrode portion.

Each of the first level electrode portion and the second level electrode portion has both side surfaces having slopes and has a top width that is greater than a bottom width, and the third level electrode portion has both side surfaces having slopes and has a top width that is less than a bottom width.

A side surface of the first level electrode portion and a side surface of the second level electrode portion are connected to a side surface of the third level electrode portion, and a slope of the side surfaces of the first and second level electrode portions is opposite a slope of the side surface of the third level electrode portion in positive and negative perspectives.

According to a further aspect of the inventive concepts, there is provided an integrated circuit semiconductor device including a plurality of cylindrical structures separated from each other on a substrate; and a plurality of supporters having an opening region exposing side surfaces of the plurality of cylindrical structures, the plurality of supporters being in contact with the side surfaces of the plurality of cylindrical structures and supporting the plurality of cylindrical structures.

The plurality of cylindrical structures include a first level electrode portion, a second level electrode portion, and a third level electrode portion, the first level electrode portion having a first height from the substrate, the second level electrode portion having a second height from a top of the first level electrode portion, and the third level electrode portion having a third height from a top of the second level electrode portion;

Each of the first level electrode portion and the second level electrode portion has both side surfaces having slopes and has a top width that is greater than a bottom width, and the third level electrode portion has both side surfaces having slopes and has a top width that is less than a bottom width.

A side surface and an opposite side surface of each of the first level electrode portion and the second level electrode portion respectively have a positive slope and a negative slope, a side surface of the third level electrode portion connected to the side surface of each of the first and second level electrode portions has a negative slope, and an opposite side surface of the third level electrode portion connected to the opposite side surface of each of the first and second level electrode portions has a positive slope.

Each of the plurality of supporters is at the side surface of the second level electrode portion, has both side surfaces having slopes, and has a top width that is less than a bottom width.

BRIEF DESCRIPTION OF THE DRAWINGS

Embodiments of the inventive concepts will be more clearly understood from the following detailed description taken in conjunction with the accompanying drawings in which.

DETAILED DESCRIPTION OF EXAMPLE EMBODIMENTS

Figure 1:
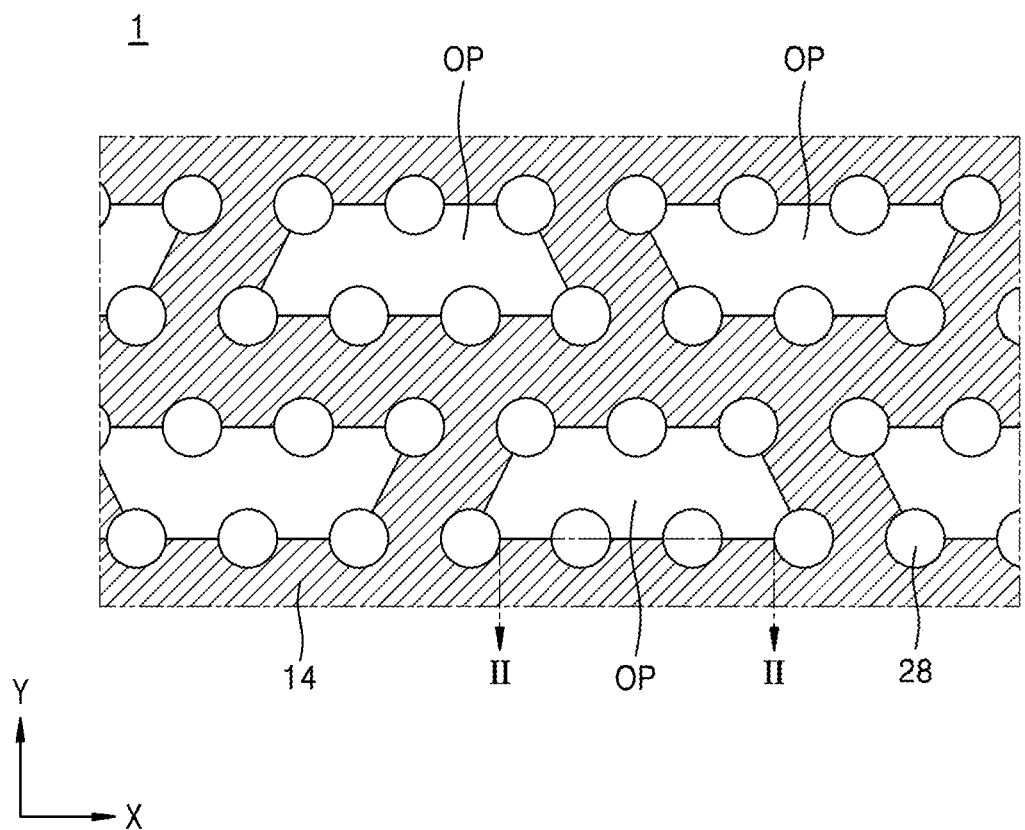
FIG. 1 is a plan view schematically illustrating the arrangement of cylindrical structures of an integrated circuit semiconductor device and supporters supporting the cylindrical structures, according to example embodiments.

Hereinafter, embodiments will be described in detail with reference to the attached drawings. Like reference numerals in the drawings denote like elements, and redundant descriptions thereof will be omitted.

FIG. 1 is a plan view schematically illustrating the arrangement of cylindrical structures of an integrated circuit semiconductor device and supporters supporting the cylindrical structures, according to example embodiments.

For example, an integrated circuit semiconductor device 1 may include a plurality of cylindrical structures 28 that are separated from each other. The cylindrical structures 28 may be referred to as pillar structures. The cylindrical structures 28 may include a metal nitride layer, e.g., a titanium nitride (TiN) layer or a titanium silicon nitride (Ti—Si—N) layer.

The cylindrical structures 28 may be repeatedly arranged in a first direction (e.g., an X direction) and a second direction (e.g., a Y direction). The number of cylindrical structures 28 illustrated in FIG. 1 is an example, and more or fewer cylindrical structures may be arranged. For example, when the cylindrical structures 28 are lower electrodes of a cell capacitor of a dynamic random access memory (DRAM) device, at least several millions of cylindrical structures 28 may be densely arranged.

Although the cylindrical structures 28 are arranged in straight lines in the first direction (e.g., the X direction) in FIG. 1, the cylindrical structures 28 may be arranged in a zigzag pattern. Although the cylindrical structures 28 are arranged in a zigzag pattern in the second direction (e.g., the Y direction) in FIG. 1, the cylindrical structures 28 may be arranged in straight lines. Embodiments are not limited to the arrangement of cylindrical structures 28.

The integrated circuit semiconductor device 1 may include supporters 14 supporting the cylindrical structures 28. The supporters 14 may be referred to as supporter patterns. It is illustrated that the supporters 14 are connected to each other in FIG. 1, but the supporters 14 may be formed as island-type supporter patterns separated from each other like islands or isolated-type supporter patterns. The supporters 14 may include a silicon nitride layer or a silicon oxynitride layer.

An opening region OP exposing a side surface (or a side wall) of each cylindrical structure 28 may be formed inside the supporters 14. In other words, the opening region OP is formed at the level of the supporters 14, thereby exposing the side surfaces of the cylindrical structures 28. The supporters 14 may support the cylindrical structures 28 by partially contacting the side surfaces of the cylindrical structures 28.

Although the opening region OP exposes side surfaces of seven cylindrical structures 28 in FIG. 1, embodiments are not limited thereto. When necessary, the opening region OP may expose side surfaces of at least four cylindrical structures 28. Although the opening region OP has a trapezoid shape according to a top view in FIG. 1, the shape of the opening region OP from a top view may be a polygon such as a tetragon or a pentagon. Embodiments are not limited by the shape of the opening region OP from a top view.

Figure 2A:
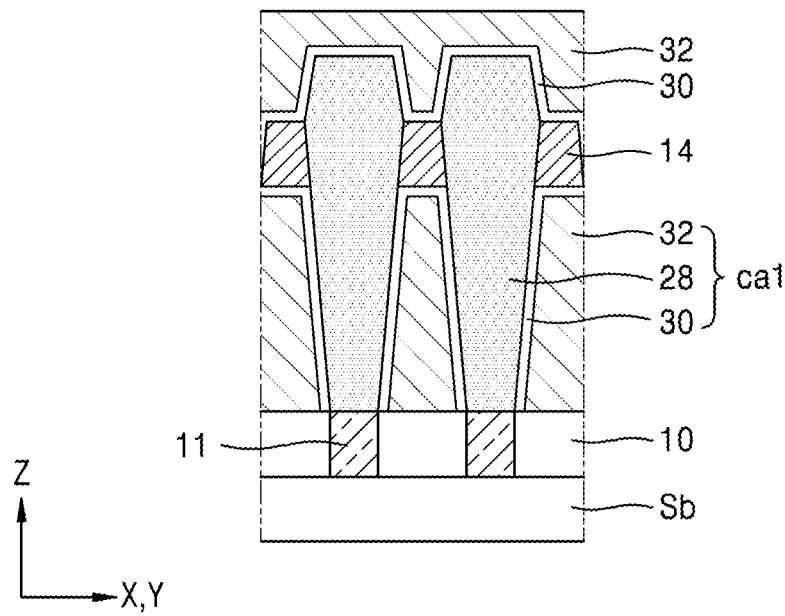
FIGS. 2A and 2B are schematic cross-sectional views of integrated circuit semiconductor devices, taken along line II-II in FIG. 1.
Figure 2B:
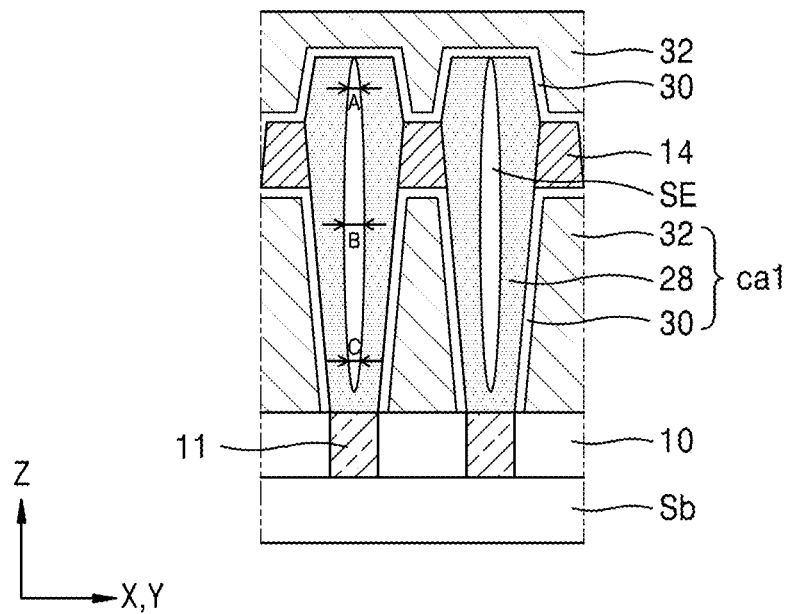
Figure 3:
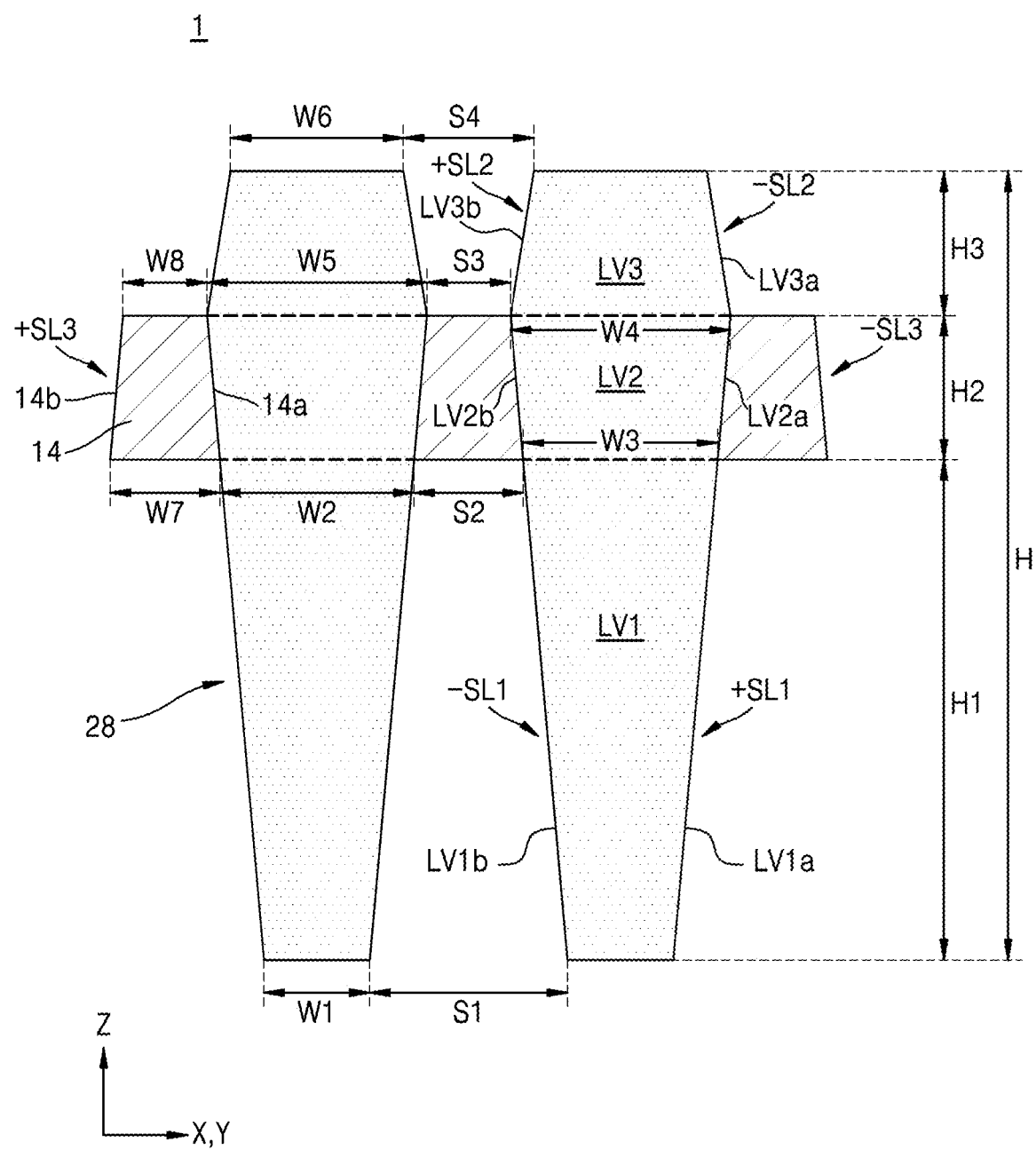
FIG. 3 is an enlarged view of cylindrical structures and supporters in FIG. 2A.

FIGS. 2A and 2B are schematic cross-sectional views of integrated circuit semiconductor devices, taken along line II-II in FIG. 1. FIG. 3 is an enlarged view of cylindrical structures and supporters in FIG. 2A.

For example, an integrated circuit semiconductor device 1-2 of FIG. 2B is the same as an integrated circuit semiconductor device 1-1 of FIG. 2A, except that a seam SE is formed inside each cylindrical structure 28. Description below may be applied to both integrated circuit semiconductor devices 1-1 and 1-2 of FIGS. 2A and 2B.

The integrated circuit semiconductor devices 1-1 and 1-2 may include cylindrical structures 28 separated from each other on a substrate Sb. In some embodiments, the substrate Sb may include a silicon substrate including silicon (Si), e.g., crystalline Si, polycrystalline Si, or amorphous Si. In some embodiments, the substrate Sb may include a semiconductor element, e.g., germanium (Ge).

In some embodiments, the substrate Sb may include at least one compound semiconductor selected from silicon germanium (SiGe), silicon carbide (SiC), gallium arsenide (GaAs), indium arsenide (InAs), and indium phosphide (InP). In some embodiments, the substrate Sb may include a silicon-on-insulator (SOI) substrate, a ceramic substrate, a quartz substrate, or a display glass substrate.

For example, unit elements(not shown) such as various kinds of active elements or passive elements may be formed in the substrate Sb. Unit elements may include transistors of a memory device, e.g., a DRAM device, or a non-memory device, e.g., a flash memory device.

An interlayer insulating layer 10 may be formed on the substrate Sb to cover the unit elements. Contact plugs 11, which may be electrically connected to unit elements, may be formed in the interlayer insulating layer 10. In the case of DRAM devices, the contact plugs 11 may be landing pads connected to cylindrical lower electrodes of a capacitor. A conductive line (not shown) connected to the contact plugs 11 may be formed in the interlayer insulating layer 10.

For example, the cylindrical structures 28 may be cylindrical lower electrodes of a capacitor of a DRAM device. The cylindrical structures 28 may be connected to a source/drain region (not shown) of a transistor (not shown) of a DRAM device, which is formed in the substrate Sb, through the contact plugs 11. However, embodiments are not limited to cylindrical lower electrodes of a capacitor of a DRAM device and may be applied to any cylindrical structures 28 that have a high aspect ratio and are repeatedly arranged.

A bottom surface of each cylindrical structure 28 may be fixed to a contact plug 11 on the substrate Sb, and the cylindrical structure 28 may have a long thin shape extending in a third direction (e.g., a Z direction) perpendicular to the first and second directions. The cylindrical structure 28 may have an aspect ratio of about 8 to about 30, e.g., an aspect ratio of 20, wherein the aspect ratio is a ratio of a height H to a width W1, W2, W3, W4, W5, or W6. For example, the widths W1 through W6 of the cylindrical structure 28 may range from about 30 nm to about 100 nm. The height H of the cylindrical structure 28 may range from about 500 nm to about 4000 nm.

The seam SE, which is in a form of a void, may be formed in the inside, e.g., a central portion, of each of the cylindrical structures 28 in FIG. 2B. In some embodiments, the seam SE may have a central width B that is greater than an upper width A and a lower width C. In some embodiments, the seam SE may be formed when the cylindrical structures 28 are formed. In some embodiments, the seam SE may be formed when the cylindrical structures 28 shrink after being formed.

As described above, the opening region OP is formed at the level of the supporters 14, and there are also open spaces below the supporters 14, as shown in FIG. 3. Accordingly, subsequent processes may also be performed on portions of the cylindrical structures 28 below the supporters 14.

For example, when the cylindrical structures 28 are cylindrical lower electrodes of a DRAM device, a dielectric layer 30 and an upper electrode 32 may be formed on surfaces of the cylindrical structures 28 in subsequent processes. The dielectric layer 30 may include a TaO film, a TaAlO film, a TaON film, an AlO film, a HfO film, a ZrO film, a ZrSiO film, a TiO film, a TiAlO film, a (Ba,Sr)TiO (BST) film, a SrTiO (STO) film, a BaTiO (BTO) film, a Pb(Zr,Ti)O (PZT) film, a (Pb,La)(Zr,Ti)O film, a Ba(Zr,Ti)O film, a Sr(Zr,Ti)O film, or a combination thereof.

The upper electrode 32 may cover the cylindrical structures 28 and completely fill between the cylindrical structures 28. The upper electrode 32 may include a metal film such as a Ru film, a RuO film, a Pt film, a PtO film, an Jr film, an IrO film, an SrRuO (SRO) film, a (Ba,Sr)RuO (BSRO) film, a CaRuO (CRO) film, a BaRuO film, a La(Sr,Co)O film, a Ti film, a TiN film, a W film, a WN film, a Ta film, a TaN film, a TiAlN film, a TiSiN film, a TaAlN film, a TaSiN film, or a combination thereof. A capacitor ca1 may be formed through the processes described above.

Hereinafter, the structure of the cylindrical structures 28, a space between the cylindrical structures 28, and the structure of the supporters 14 will be described in detail using the integrated circuit semiconductor device 1-1 of FIG. 2A.

The cylindrical structures 28 may include a first level electrode portion LV1 having a first height H1 in the third direction (e.g., the Z direction), a second level electrode portion LV2 having a second height H2 from the top of the first level electrode portion LV1 in the third direction (e.g., the Z direction), and a third level electrode portion LV3 having a third height H3 from the top of the second level electrode portion LV2 in the third direction (e.g., the Z direction).

In this specification, the term "level" refers to a height from the main surface of the substrate Sb in a vertical direction. In other words, "being at the same level" or "being at a certain level" refers to "having the same height from the main surface of the substrate Sb in the vertical direction" or "being at a certain position", and "being at a low/high level" refers to "being at a low/high position with respect to the main surface of the substrate Sb in the vertical direction".

The first height H1 of the first level electrode portion LV1 may be greater than the second height H2 of the second level electrode portion LV2 and the third height H3 of the third level electrode portion LV3. The second height H2 of the second level electrode portion LV2 may be nearly equal to the third height H3 of the third level electrode portion LV3. The first height H1, the second height H2, and the third height H3 are arbitrary and do not limit embodiments.

Opposite sides of the first level electrode portion LV1 have a slope. The width W2 of the top of the first level electrode portion LV1 may be greater than the width W1 of the bottom of the first level electrode portion LV1. Opposite sides of the second level electrode portion LV2 have a slope. The width W4 of the top of the second level electrode portion LV2 may be greater than the width W3 of the bottom of the second level electrode portion LV2.

Opposite sides of the third level electrode portion LV3 have a slope. The width W6 of the top of the third level electrode portion LV3 may be less than the width W5 of the bottom of the third level electrode portion LV3. The tops and bottoms of the first through third level electrode portions LV1 through LV3 may include portions thereof near the tops and bottoms.

A side surface LV1a of the first level electrode portion LV1 and a side surface LV2a of the second level electrode portion LV2 may be connected to a side surface LV3a of the third level electrode portion LV3, and an opposite side surface LV1b of the first level electrode portion LV1 and an opposite side surface LV2b of the second level electrode portion LV2 may be connected to an opposite side surface LV3b of the third level electrode portion LV3. A slope +SL1 of the side surfaces LV1a and LV2a of the first and second level electrode portions LV1 and LV2 and a slope −SL1 of the opposite side surfaces LV1b and LV2b of the first and second level electrode portions LV1 and LV2 may be opposite slopes −SL2 and +SL2 of the side surfaces LV3a and LV3b of the third level electrode portion LV3 in positive and negative perspectives.

For example, the side surfaces LV1a and LV2a of the first and second level electrode portions LV1 and LV2 may have the positive slope +SL1, and the opposite side surfaces LV1b and LV2b of the first and second level electrode portions LV1 and LV2 may have the negative slope −SL1. The side surface LV3a of the third level electrode portion LV3, which is connected to the side surfaces LV1a and LV2a of the first and second level electrode portions LV1 and LV2 that have the positive slope +SL1, may have the negative slope −SL2. The opposite side surface LV3b of the third level electrode portion LV3, which is connected to the opposite side surfaces LV1b and LV2b of the first and second level electrode portions LV1 and LV2 that have the negative slope −SL1, may have the positive slope +SL2.

A bottom space Si between first level electrode portions LV1 may be greater than a top space S2 therebetween. When the bottom space S1 between the first level electrode portions LV1 is greater than the top space S2 therebetween, a membrane, e.g., a dielectric layer or an electrode layer, may be easily formed on lower portions of the first level electrode portions LV1, which are located near the substrate Sb. A supporter 14 may be between second level electrode portions LV2.

A bottom space S3 between third level electrode portions LV3 may be less than a top space S4 therebetween. In other words, the top space S4 between the third level electrode portions LV3 may be greater than the bottom space S3 therebetween. When the top space S4 between the third level electrode portions LV3 is greater than the bottom space S3 therebetween, a membrane, e.g., a dielectric layer or an electrode layer, may be easily formed on the third level electrode portions LV3, which are located above the substrate Sb.

The cylindrical structures 28 having a high aspect ratio may not stand upright by themselves but may tilt toward an adjacent cylindrical structure 28 or may break. In particular, when the cylindrical structures 28 having a high aspect ratio include the seam SE therein, the cylindrical structures 28 may be highly likely to tilt or break. Therefore, the supporters 14 supporting the cylindrical structures 28 may be provided such that the cylindrical structures 28 may stand upright and be separated from each other.

As described above, the supporters 14 may support the cylindrical structures 28 by partially contacting side surfaces of the cylindrical structures 28. A side surface 14a and an opposite side surface 14b of each supporter 14 may have slopes. A top width W8 of the supporter 14 may be less than a bottom width W7 thereof. The side surfaces 14a and 14b of the supporter 14 may be respectively in contact with cylindrical structures 28, for example, the side surfaces LV2a and LV2b of respective adjacent second level electrode portions LV2.

The supporter 14 may include the side surface 14a and the opposite side surface 14b corresponding to the side surface 14a. The side surface 14a and the opposite side surface 14b of the supporter 14 may respectively have a negative slope −SL3 and a positive slope +SL3. When the side surface 14a and the opposite side surface 14b of the supporter 14 have slopes and the bottom width W7 of the supporter 14 is greater than the top width W8 thereof, the cylindrical structures 28 may be readily reduced or prevented from tilting or breaking.

The supporters 14 may be at a certain height lower than the top surfaces of the cylindrical structures 28. The supporters 14 may be at a height that is at least $7/10$ of the height H of the cylindrical structures 28. The supporters 14 may have a thickness that is about $1/10$ to about $3/10$ of the height of the cylindrical structures 28.

Cylindrical structures 28, e.g., third level electrode portions LV3, located higher than the supporters 14 may have the side surface LV3a and the opposite side surface LV3b, which have slopes, and the width W6 of the top of the third level electrode portions LV3 may be less than the width W5 of the bottom thereof, as described above. The top space S4 between the cylindrical structures 28, e.g., the third level electrode portions LV3, located higher than the supporters 14 may be greater than the bottom space S3 therebetween.

Cylindrical structures 28, e.g., second level electrode portions LV2, located at the same level as the supporters 14 may have the side surface LV2a and the opposite side surface LV2b, which have slopes, and the width W4 of the top of the second level electrode portions LV2 may be greater than the width W3 of the bottom thereof, as described above. Cylindrical structures 28, e.g., first level electrode portions LV1, located lower than the supporters 14 may have the side surface LV1a and the opposite side surface LV1b, which have slopes, and the width W2 of the top of the first level electrode portions LV1 may be greater than the width W1 of the bottom thereof.

As described above, when the supporters 14 are located at a lower level than the top surface of the cylindrical structures 28, the cylindrical structures 28 may be readily reduced or prevented from tilting or breaking. In addition, when the width W6 of the top of the cylindrical structures 28, e.g., the third level electrode portions LV3, located above the supporters 14 is less than the width W5 of the bottom thereof, the cylindrical structures 28 may be reduced or prevented from sticking to each other.

Figure 4A:
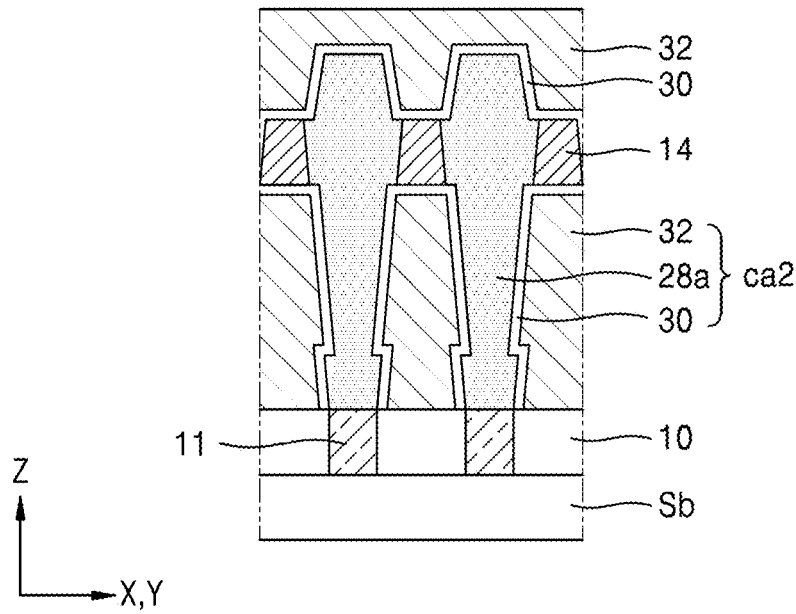
FIGS. 4A and 4B are cross-sectional views of integrated circuit semiconductor devices according to example embodiments.
Figure 4B:
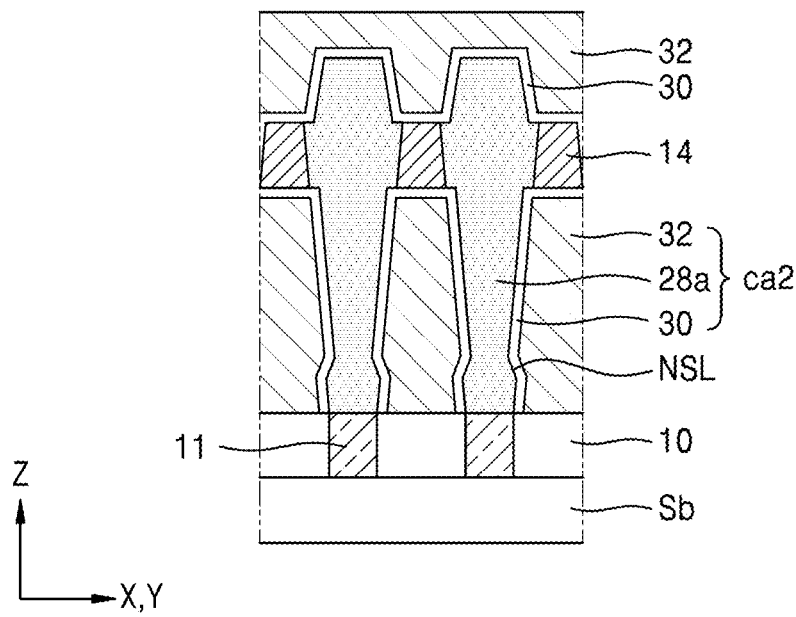
Figure 5:
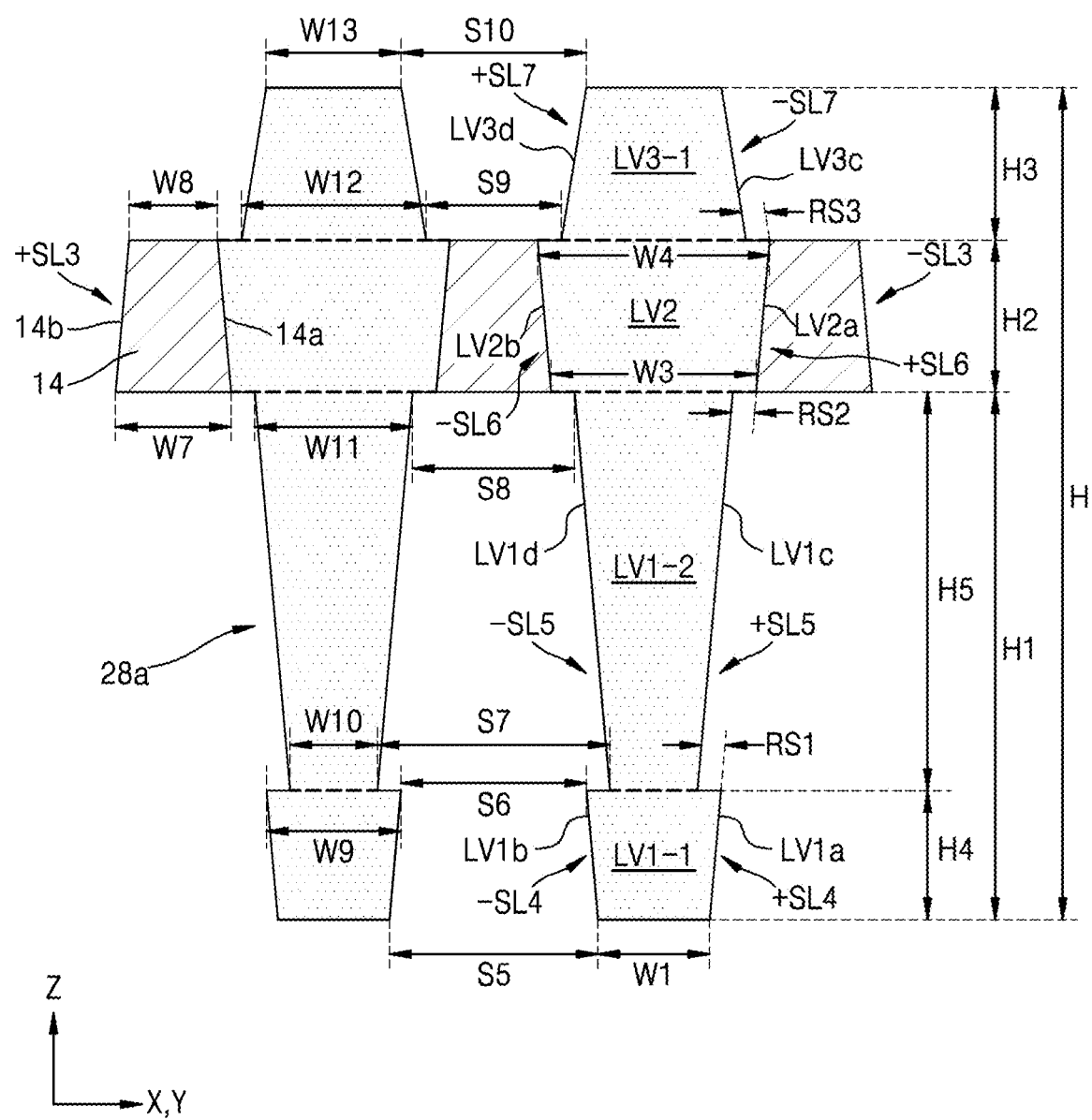
FIG. 5 is an enlarged view of cylindrical structures and supporters in FIG. 4A.

FIGS. 4A and 4B are cross-sectional views of integrated circuit semiconductor devices according to embodiments, and FIG. 5 is an enlarged view of cylindrical structures and supporters in FIG. 4A.

For example, integrated circuit semiconductor devices 3-1 and 3-2 of FIGS. 4A and 4B, respectively, may be schematic cross-sectional views taken along line II-II in FIG. 1, except for the structure of cylindrical structures 28a.

The integrated circuit semiconductor device 3-1 of FIG. 4A may be the same as the integrated circuit semiconductor device 3-2 of FIG. 4B, except for the profile of a side wall of each cylindrical structure 28a. In other words, the integrated circuit semiconductor device 3-2 of FIG. 4B may be the same as the integrated circuit semiconductor device 3-1 of FIG. 4A, except that a slope NSL is formed at each of both side walls of a lower portion of the cylindrical structure 28a.

The integrated circuit semiconductor devices 3-1 and 3-2 of FIGS. 4A through 5 may be nearly the same as the integrated circuit semiconductor devices 1, 1-1, and 1-2 of FIGS. 1 through 3, except for the side profile or structure of the cylindrical structure 28a and existence or non-existence of a seam. In FIGS. 1 through 5, like reference numerals denote like elements.

The integrated circuit semiconductor devices 3-1 and 3-2 may include cylindrical structures 28a separated from each other on the substrate Sb. The contact plugs 11 may be formed in the interlayer insulating layer 10 on the substrate Sb. A bottom surface of each cylindrical structure 28a may be fixed to a contact plug 11 on the substrate Sb, and the cylindrical structure 28 may have a long thin shape extending in the third direction (e.g., the Z direction) perpendicular to the first direction (e.g., the X direction) and the second direction (e.g., the Y direction).

When the cylindrical structures 28a are cylindrical lower electrodes of a DRAM device, the dielectric layer 30 and the upper electrode 32 may be formed on surfaces of the cylindrical structures 28a. A capacitor ca2 may be formed through the processes described above.

Hereinafter, the structure of the cylindrical structures 28a, a space between the cylindrical structures 28a, and the structure of the supporters 14 will be described in detail using the integrated circuit semiconductor device 3-1 of FIG. 4A.

The cylindrical structures 28a may include a first level electrode portion having the first height H1 in the third direction (e.g., the Z direction), the second level electrode portion LV2 having the second height H2 from the top of the first level electrode portion in the third direction (e.g., the Z direction), and a third level electrode portion LV3-1 having the third height H3 from the top of the second level electrode portion LV2 in the third direction (e.g., the Z direction).

The first level electrode portion includes a lower level electrode portion LV1-1, which has a fourth height H4 from the top of the substrate Sb in the third direction (e.g., the Z direction), and an upper level electrode portion LV1-2, which has a fifth height H5 from the top of the lower level electrode portion LV1-1 in the third direction (e.g., the Z direction). The fourth and fifth heights H4 and H5 are arbitrary and do not limit embodiments.

The lower level electrode portion LV1-1 may have a top width W9 and a bottom width W1. Both side surfaces of the lower level electrode portion LV1-1 have slopes. The top width W9 of the lower level electrode portion LV1-1 may be greater than the bottom width W1 thereof.

The upper level electrode portion LV1-2 may have side surfaces LV1c and LV1d, which are respectively recessed by a first depth RS1 inward from the side surfaces LV1a and LV1b of the lower level electrode portion LV1-1. The upper level electrode portion LV1-2 may have the side surfaces LV1c and LV1d, which are respectively recessed by a second depth RS2 inward from the side surfaces LV2a and LV2b of the second level electrode portion LV2. As shown in FIG. 4B, not a level surface but the slope NSL may be formed as a side wall between the lower level electrode portion LV1-1 and the upper level electrode portion LV1-2.

The upper level electrode portion LV1-2 may have a top width W11 and a bottom width W10. The bottom width W10 of the upper level electrode portion LV1-2 may be less than the top width W9 of the lower level electrode portion LV1-1. The width W3 of the bottom of the second level electrode portion LV2 may be greater than the top width W11 of the upper level electrode portion LV1-2. Both side surfaces of the second level electrode portion LV2 may have slopes. The width W4 of the top of the second level electrode portion LV2 may be greater than the width W3 of the bottom thereof.

The third level electrode portion LV3-1 may have side surfaces LV3c and LV3d, which are respectively recessed by a third depth RS3 inward from the side surfaces LV2a and LV2b of the second level electrode portion LV2. The third level electrode portion LV3-1 may have a top width W13 and a bottom width W12. The bottom width W12 of the third level electrode portion LV3-1 may be less than the width W4 of the top of the second level electrode portion LV2. Both side surfaces of the third level electrode portion LV3-1 may have slopes.

The side surfaces LV1a and LV1b of the lower level electrode portion LV1-1 may be respectively connected to the side surfaces LV1c and LV1d of the upper level electrode portion LV1-2 via recessed flat surfaces. The side surfaces LV1c and LV1d of the upper level electrode portion LV1-2 may be respectively connected to the side surfaces LV2a and LV2b of the second level electrode portion LV2 via recessed flat surfaces. The side surfaces LV2a and LV2b of the second level electrode portion LV2 may be respectively connected to the side surfaces LV3c and LV3d of the third level electrode portion LV3-1 via recessed flat surfaces.

Slopes +SL4, +SL5, and +SL6 of the side surfaces LV1a, LV1c, and LV2a of the lower, upper, and second level electrode portions LV1-1, LV1-2, and LV2 and slopes −SL4, −SL5, and −SL6 of the opposite side surfaces LV1b, LV1d, and LV2b of the lower, upper, and second level electrode portions LV1-1, LV1-2, and LV2 may be opposite slopes −SL7 and +SL7 of the side surfaces LV3c and LV3d of the third level electrode portion LV3-1 in positive and negative perspectives. The slopes +SL4 and −SL4 may be similar to or the same as the slopes +SL1 and −SL1 in FIG. 3. The slopes +SL6 and −SL6 may be similar to or the same as the slopes +SL1 and −SL1 in FIG. 3. The slopes +SL7 and −SL7 may be similar to or the same as the slopes +SL2 and −SL2 in FIG. 3.

For example, the side surfaces LV1a, LV1c, and LV2a of the lower, upper, and second level electrode portions LV1-1, LV1-2, and LV2 may have the positive slopes +SL4, +SL5, and +SL6, and the opposite side surfaces LV1b, LV1d, and LV2b of the lower, upper, and second level electrode portions LV1-1, LV1-2, and LV2 may have the negative slopes −SL4, −SL5, and −SL6.

The side surface LV3c of the third level electrode portion LV3-1, which is connected to the side surfaces LV1a, LV1c, and LV2a of the lower, upper, and second level electrode portions LV1-1, LV1-2, and LV2 that have the positive slopes +SL4, +SL5, and +SL6, may have the negative slope −SL7, which is opposite the positive slopes +SL4, +SL5, and +SL6 in positive and negative perspectives. The opposite side surface LV3d of the third level electrode portion LV3-1, which is connected to the opposite side surfaces LV1b, LV1d, and LV2b of the lower, upper, and second level electrode portions LV1-1, LV1-2, and LV2 that have the negative slopes −SL4, −SL5, and −SL6, may have the positive slope +SL7, which is opposite the negative slopes −SL4, −SL5, and −SL6 in positive and negative perspectives.

A bottom space S5 between lower level electrode portions LV1-1 may be greater than a top space S6 therebetween. The bottom space S5 may be similar to or the same as the bottom space S1 in FIG. 3. A bottom space S7 between upper level electrode portions LV1-2 may be greater than a top space S8 therebetween. The top space S8 may be greater than the top space S2 in FIG. 3. A bottom space S9 between third level electrode portions LV3-1 may be greater than a top space S10 therebetween. The bottom space S9 may be greater than the bottom space S3 in FIG. 3.

The supporters 14 supporting the cylindrical structures 28a may be provided such that the cylindrical structures 28a may stand upright and be separated from each other. As described above, the supporters 14 may support the cylindrical structures 28a by partially contacting side surfaces of the cylindrical structures 28a. The side surface 14a and the opposite side surface 14b of each supporter 14 may have slopes. The top width W8 of the supporter 14 may be less than the bottom width W7 thereof.

The side surfaces 14a and 14b of the supporter 14 may be respectively in contact with cylindrical structures 28a, for example, the side surfaces LV2a and LV2b of respective adjacent second level electrode portions LV2. The supporter 14 may include the side surface 14a and the opposite side surface 14b corresponding to the side surface 14a. The side surface 14a and the opposite side surface 14b of the supporter 14 may respectively have the negative slope −SL3 and the positive slope +SL3.

In the integrated circuit semiconductor devices 3-1 and 3-2, the upper level electrode portion LV1-2 is formed by recessing inward the first level electrode portion LV1 in FIGS. 1 through 3. In addition, the third level electrode portion LV3 in FIGS. 1 through 3 is recessed. The integrated circuit semiconductor devices 3-1 and 3-2 may increase the surface area of the cylindrical structures 28a. When the cylindrical structures 28a form cylindrical lower electrodes, capacitance may be increased.

In addition, the integrated circuit semiconductor devices 3-1 and 3-2 may reduce or prevent the cylindrical structures 28a from sticking to each other because the top width W13 of the cylindrical structures 28a above the supporters 14 is much less than the bottom width W12.

Figure 6:
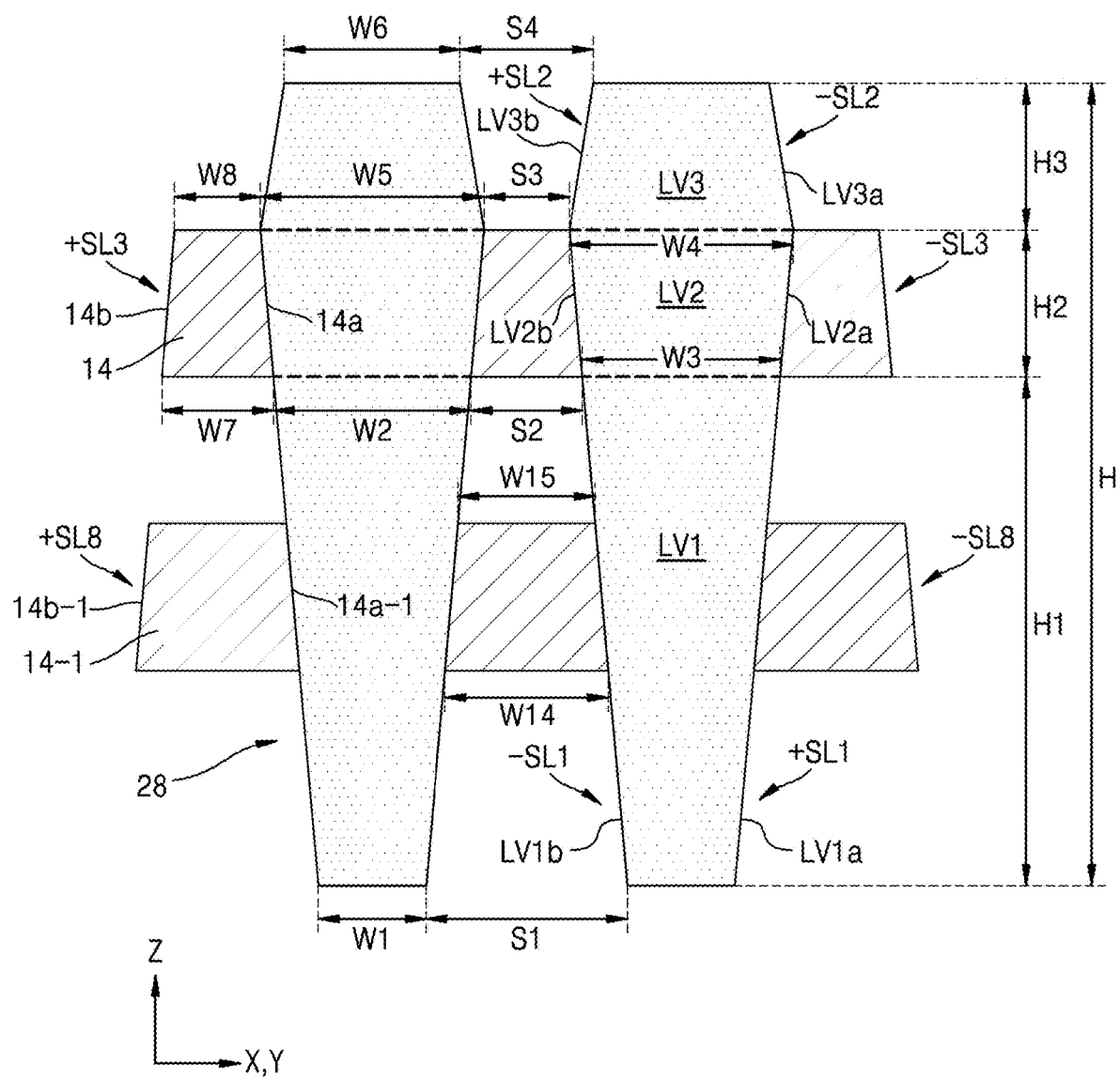
FIG. 6 is a cross-sectional view for describing cylindrical structures and supporters of an integrated circuit semiconductor device, according to example embodiments.

FIG. 6 is a cross-sectional view for describing cylindrical structures and supporters of an integrated circuit semiconductor device, according to example embodiments.

For example, an integrated circuit semiconductor device 5 may be the same as the integrated circuit semiconductor device 1 of FIG. 3, except that the integrated circuit semiconductor device 5 further includes additional supporters 14-1. In FIGS. 3 and 6, like reference numerals denote like elements.

The integrated circuit semiconductor device 5 may include an additional supporter 14-1 on a side surface of the first level electrode portion LV1 of each cylindrical structure 28. Similarly to the supporters 14, a side surface 14a-1 and an opposite side surface 14b-1 of the additional supporter 14-1 may have slopes, and a top width W15 of the additional supporter 14-1 may be less than a bottom width W14 thereof. The side surfaces 14a-1 and 14b-1 of the additional supporter 14-1 may be respectively in contact with cylindrical structures 28, for example, the side surfaces LV1a and LV1b of respective adjacent first level electrode portions LV1.

The additional supporter 14-1 may include the side surface 14a-1 and the opposite side surface 14b-1 corresponding to the side surface 14a-1. The side surface 14a-1 and the opposite side surface 14b-1 of the additional supporter 14-1 may respectively have a negative slope −SL8 and a positive slope +SL8. When the side surface 14a-1 and the opposite side surface 14b-1 of the additional supporter 14-1 have slopes and the bottom width W14 of the additional supporter 14-1 is greater than the top width W15 thereof, the cylindrical structures 28 may be more readily reduced or prevented from tilting or breaking. The integrated circuit semiconductor device 5 includes one kind of additional supporters 14-1 in FIG. 6, but a plurality of additional supporters may be provided on the first level electrode portion LV1 in the vertical direction (e.g., the Z direction).

Figure 7:
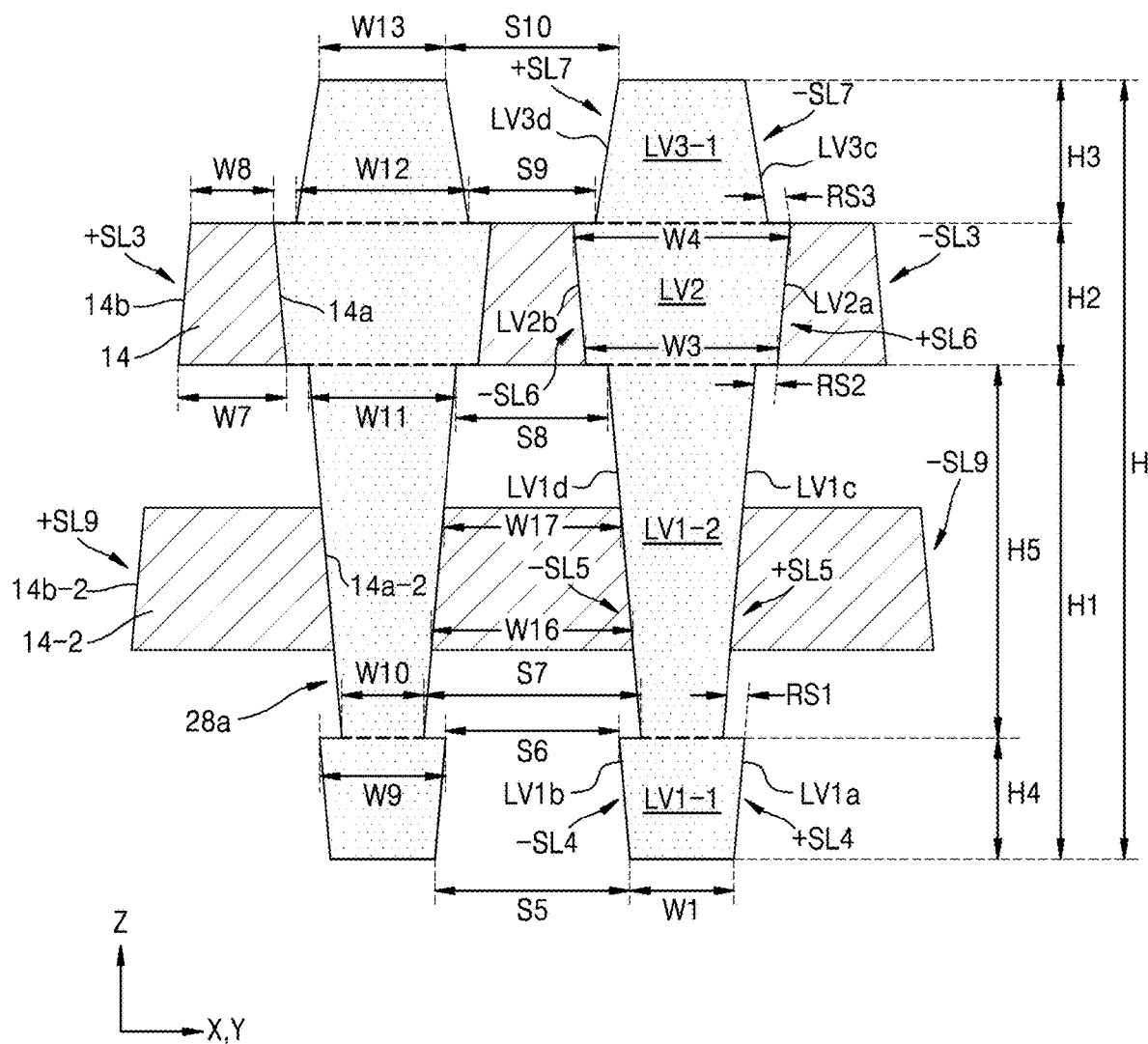
FIG. 7 is a cross-sectional view for describing cylindrical structures and supporters of an integrated circuit semiconductor device, according to example embodiments.

FIG. 7 is a cross-sectional view for describing cylindrical structures and supporters of an integrated circuit semiconductor device, according to example embodiments.

For example, an integrated circuit semiconductor device 7 may be the same as the integrated circuit semiconductor device 3 of FIG. 5, except that the integrated circuit semiconductor device 7 further includes additional supporters 14-2. In FIGS. 5 and 7, like reference numerals denote like elements.

The integrated circuit semiconductor device 7 may include an additional supporter 14-2 on a side surface of the upper level electrode portion LV1-2 of each cylindrical structure 28a. Similarly to the supporters 14, a side surface 14a-2 and an opposite side surface 14b-2 of the additional supporter 14-2 may have slopes, and a top width W17 of the additional supporter 14-2 may be less than a bottom width W16 thereof. The side surfaces 14a-2 and 14b-2 of the additional supporter 14-2 may be respectively in contact with cylindrical structures 28a, for example, the side surfaces LV1c and LV1d of respective adjacent upper level electrode portions LV1-2.

The additional supporter 14-2 may include the side surface 14a-2 and the opposite side surface 14b-2 corresponding to the side surface 14a-2. The side surface 14a-2 and the opposite side surface 14b-2 of the additional supporter 14-2 may respectively have a negative slope −SL9 and a positive slope +SL9. When the side surface 14a-2 and the opposite side surface 14b-2 of the additional supporter 14-2 have slopes and the bottom width W16 of the additional supporter 14-2 is greater than the top width W17 thereof, the cylindrical structures 28a may be more readily reduced or prevented from tilting or breaking. The integrated circuit semiconductor device 7 includes one kind of additional supporters 14-2 in FIG. 7, but a plurality of additional supporters may be provided on the upper level electrode portion LV1-2 in the vertical direction (e.g., the Z direction).

FIGS. 8 through 15 are cross-sectional views for describing a method of manufacturing an integrated circuit semiconductor device, according to example embodiments.

For example, FIGS. 8 through 15 are diagrams for describing a method of manufacturing the integrated circuit semiconductor device 1 of FIGS. 1 through 3. In FIGS. 1 through 3 and FIGS. 8 through 15, like reference numerals may denote like elements. In FIGS. 8 through 15, the substrate Sb is not illustrated for convenience of description.

Figure 8:
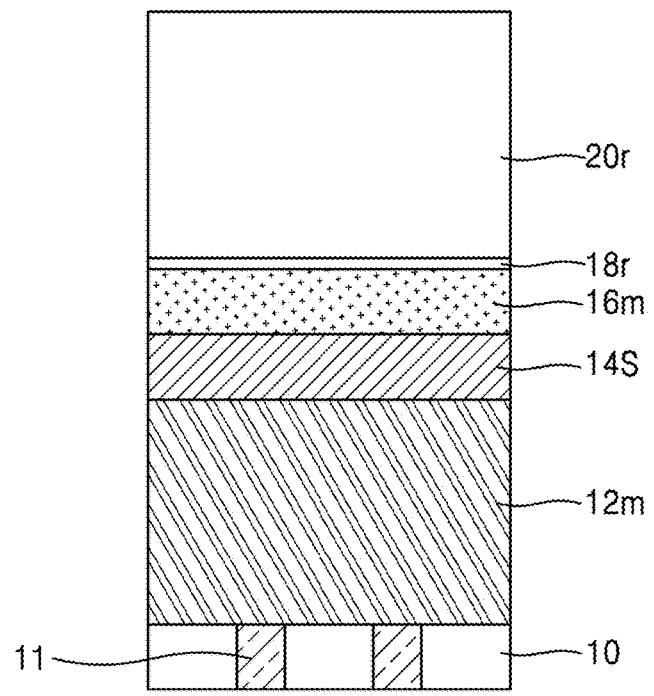
FIGS. 8 through 15 are cross-sectional views for describing a method of manufacturing an integrated circuit semiconductor device, according to example embodiments.

Referring to FIG. 8, the interlayer insulating layer 10 (hereinafter, referred to as the first interlayer insulating layer 10) is formed on the substrate (Sb in FIGS. 2 and 3) and the contact plugs 11 are formed in the first interlayer insulating layer 10. A second interlayer insulating layer 12m, a supporter layer 14S, a third interlayer insulating layer 16m, an etch stop layer 18r, and a mask layer 20r are sequentially formed on the first interlayer insulating layer 10 and the contact plugs 11. The second interlayer insulating layer 12m is thicker than the supporter layer 14S and the third interlayer insulating layer 16m.

The first interlayer insulating layer 10, the second interlayer insulating layer 12m, and the third interlayer insulating layer 16m may include a silicon oxide layer. The supporter layer 14S and the etch stop layer 18r may include a silicon nitride layer or a silicon oxynitride layer. The mask layer 20r may include a polysilicon layer.

Figure 9:
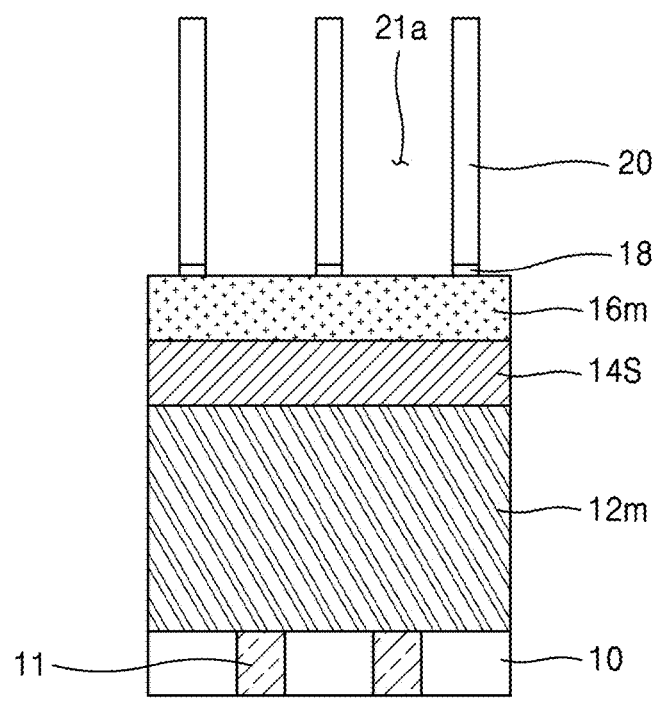
Figure 10:
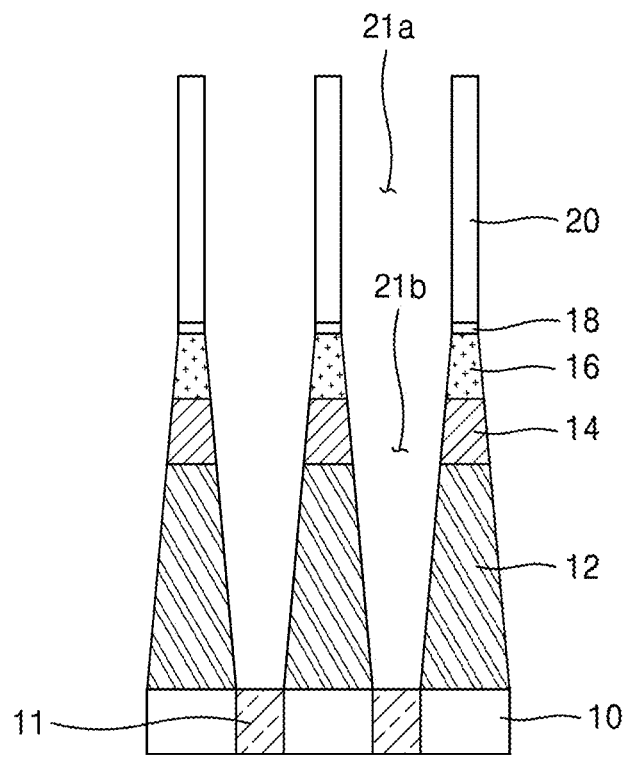

Referring to FIGS. 9 and 10, mask patterns 20 and etch stop patterns 18 are formed by patterning the mask layer 20r and the etch stop layer 18r using photolithography, as shown in FIG. 9. First holes 21a exposing the third interlayer insulating layer 16m may be formed among the mask patterns 20 and the etch stop patterns 18.

As shown in FIG. 10, the third interlayer insulating layer 16m, the supporter layer 14S, and the second interlayer insulating layer 12m are sequentially etched using the mask patterns 20 and the etch stop patterns 18 as an etch mask. Accordingly, second interlayer insulating patterns 12, the supporters 14, and third interlayer insulating patterns 16 may be formed on the first interlayer insulating layer 10.

Widths of the second interlayer insulating patterns 12, the supporters 14, and the third interlayer insulating patterns 16 may decrease away from the first interlayer insulating layer 10 due to the nature of etching. In other words, the width of each of the second interlayer insulating patterns 12, the supporters 14, and the third interlayer insulating patterns 16 may increase away from a top toward a bottom due to the nature of etching. Both side surfaces of each of the second interlayer insulating patterns 12, the supporters 14, and the third interlayer insulating patterns 16 may have slopes.

When the second interlayer insulating patterns 12, the supporters 14, and the third interlayer insulating patterns 16 are formed, second holes 21b exposing the contact plugs 11 may be formed. The second holes 21b may communicate with the first holes 21a. The second holes 21b may be wider away from the contact plugs 11 due to the nature of etching. In other words, the second holes 21b may be narrower toward the contact plugs 11 from a top to a bottom.

Figure 11:
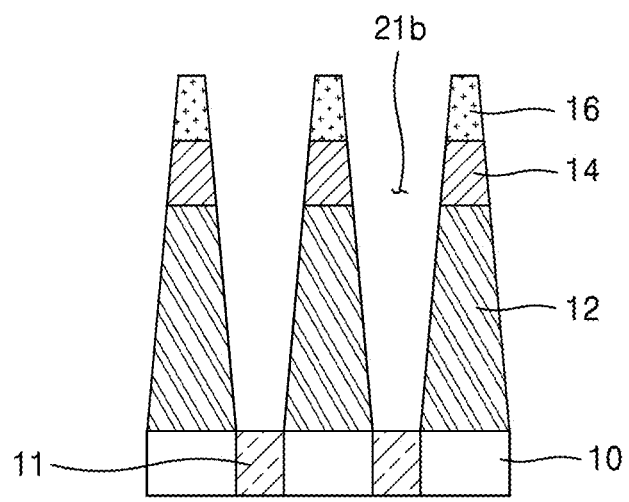
Figure 12:
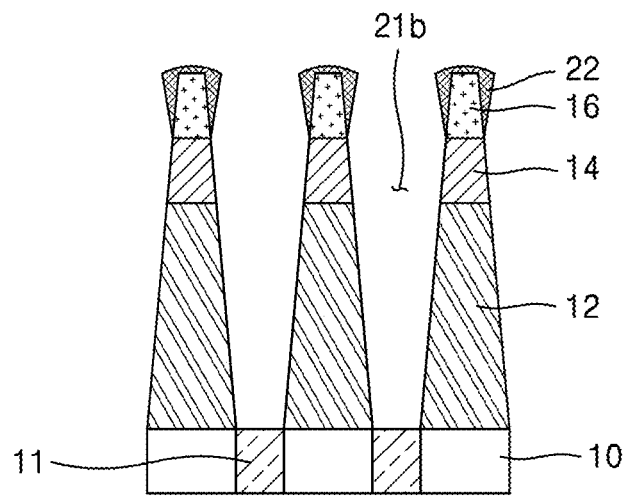

Referring to FIGS. 11 and 12, the mask patterns 20 and the etch stop patterns 18 are removed, as shown in FIG. 11. During the removing of the mask patterns 20, the etch stop patterns 18 may also be removed. As a result, the second interlayer insulating patterns 12, the supporters 14, and the third interlayer insulating patterns 16, which have the second holes 21b thereamong on the first interlayer insulating layer 10, may be formed, wherein the second holes 21b expose the contact plugs 11.

As shown in FIG. 12, a spacer layer 22 is formed on both side surfaces and a top surface of each of the third interlayer insulating patterns 16. The spacer layer 22 may include a silicon nitride layer. The spacer layer 22 may be formed on both side surfaces of the third interlayer insulating patterns 16 only but not the supporters 14 and the second interlayer insulating patterns 12.

Figure 13:
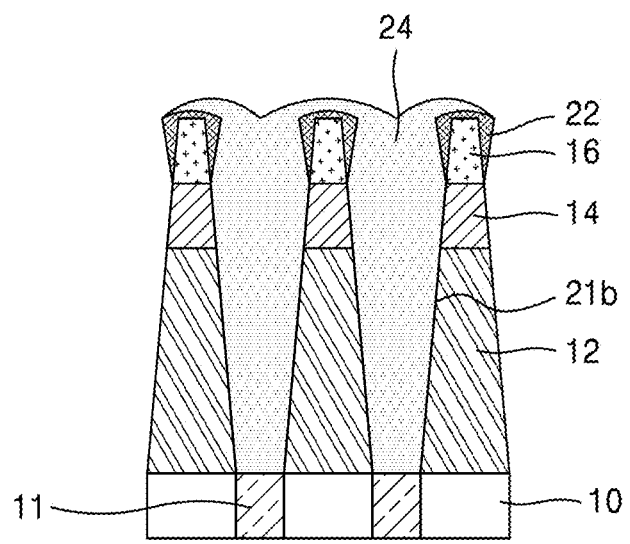
Figure 14:
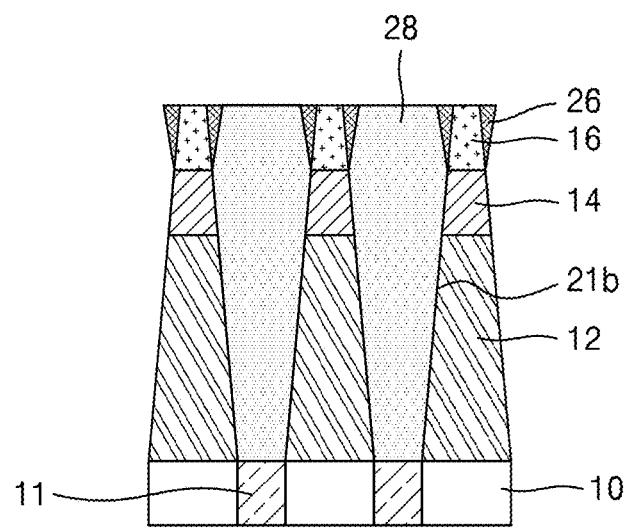

Referring to FIGS. 13 and 14, a cylindrical material layer 24 is formed to sufficiently fill the second holes 21b, as shown in FIG. 13. The cylindrical material layer 24 may be formed on the tops of the contact plugs 11 and among the second interlayer insulating patterns 12, the supporters 14, and the third interlayer insulating patterns 16. The cylindrical material layer 24 may include a metal nitride layer, e.g., a titanium nitride (TiN) layer or a titanium silicon nitride (Ti—Si—N) layer.

As shown in FIG. 14, the cylindrical structures 28 and spacers 26 are formed by etching and planarizing the cylindrical material layer 24 and the spacer layer 22 using the top surfaces of the third interlayer insulating patterns 16 as an etch stop line or point. The spacers 26 may be respectively formed on both side surfaces of the third interlayer insulating patterns 16. The spacers 26 may be respectively formed on both side surfaces of the third interlayer insulating patterns 16 and have an inverted triangle shape of which the width decreases from a top toward a bottom.

The cylindrical structures 28 may be formed in the second holes 21b and on the contact plugs 11 among the second interlayer insulating patterns 12, the supporters 14, and the spacers 26. An outer surface profile (or structure) of the cylindrical structures 28 may be defined by an inner profile of the second holes 21b in FIG. 12 and a side profile of the spacer layer 22.

Figure 15:
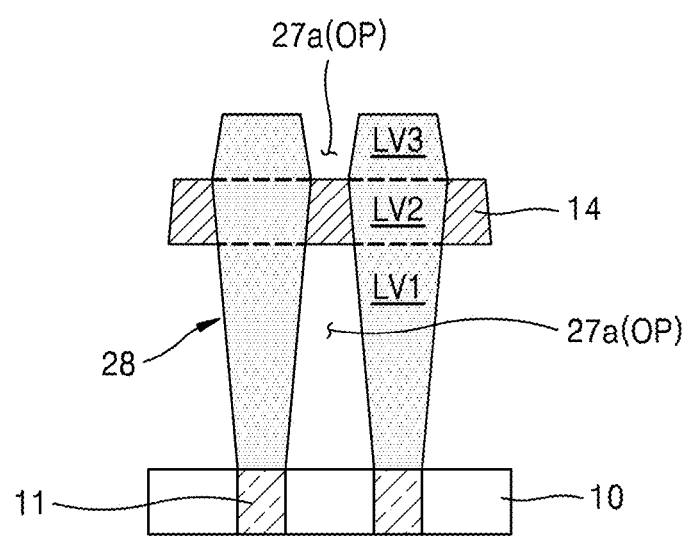

Referring to FIG. 15, a third hole 27a is formed by removing the third interlayer insulating patterns 16, the spacers 26, and the second interlayer insulating patterns 12. The third hole 27a may correspond to the opening region OP in FIG. 1.

The third interlayer insulating patterns 16, the spacers 26, and the second interlayer insulating patterns 12 may be removed by wet etching. In some embodiments, the third interlayer insulating patterns 16, the spacers 26, and the second interlayer insulating patterns 12 may be removed using an etchant, e.g., limulus amoebocyte lysate (LAL). While the third interlayer insulating patterns 16 and the second interlayer insulating patterns 12 are being etched, the spacers 26 may also be removed.

As a result of removing the third interlayer insulating patterns 16, the spacers 26, and the second interlayer insulating patterns 12, the cylindrical structures 28 may be formed on the contact plugs 11 and the supporters 14 may be at a certain height lower than the top surfaces of the cylindrical structures 28.

As described above, the cylindrical structures 28 may include the first level electrode portion LV1, the second level electrode portion LV2, and the third level electrode portion LV3. The side profile of the first level electrode portion LV1 may have slopes according to the side profile of the second interlayer insulating patterns 12. The side profile of the third level electrode portion LV3 may have slopes according to the side profile of the spacers 26. The side profile of the cylindrical structures 28 has been described above and is thus omitted.

Figure 16:
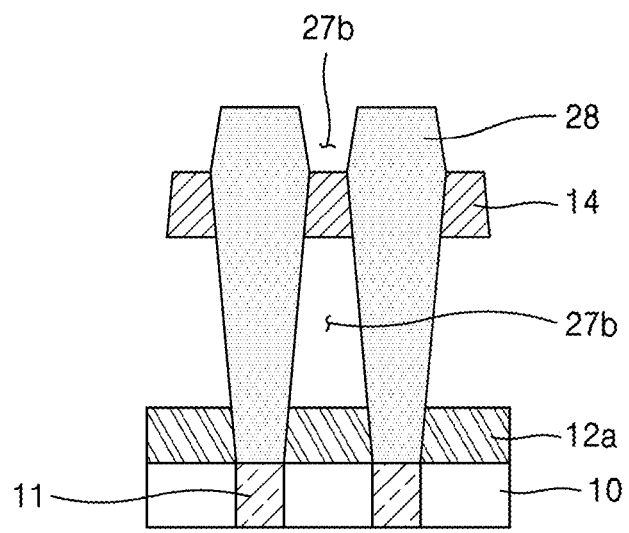
FIGS. 16 and 17 are cross-sectional views for describing a method of manufacturing an integrated circuit semiconductor device, according to example embodiments.
Figure 17:
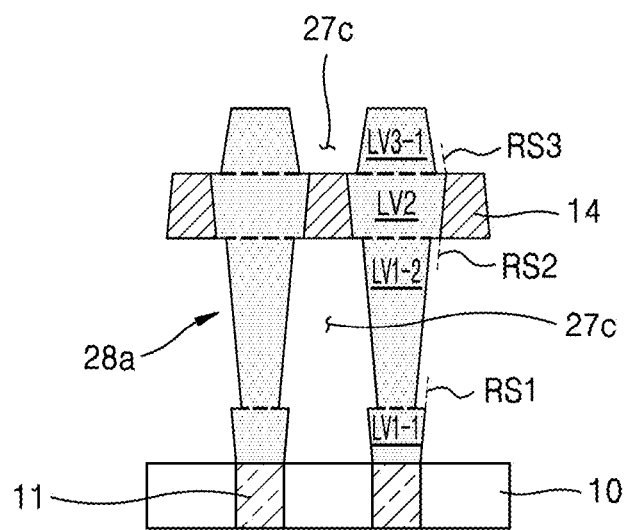

FIGS. 16 and 17 are cross-sectional views for describing a method of manufacturing an integrated circuit semiconductor device, according to example embodiments.

For example, FIGS. 16 and 17 are diagrams for describing a method of manufacturing the integrated circuit semiconductor device 3-1 of FIGS. 4 and 5. In FIGS. 4, 5, and 8 through 17, like reference numerals may denote like elements.

Stages of FIGS. 8 through 14 described above are performed. As a result, as shown in FIG. 14, the second interlayer insulating patterns 12, the supporters 14, the third interlayer insulating patterns 16, and the spacers 26 are formed on the first interlayer insulating layer 10. The cylindrical structures 28 may be formed in the second holes 21b and on the contact plugs 11 among the second interlayer insulating patterns 12, the supporters 14, and the spacers 26.

Referring to FIG. 16, fourth holes 27b are formed by completely removing the third interlayer insulating patterns 16 and the spacers 26 and part of the second interlayer insulating patterns 12. Fourth interlayer insulating patterns 12a may be formed in the fourth holes 27b. The fourth interlayer insulating patterns 12a may be residues of the second interlayer insulating patterns 12.

In some embodiments, the entirety of the third interlayer insulating patterns 16 and the spacers 26 and part of the second interlayer insulating patterns 12 may be removed using an etchant, e.g., LAL, as described above. While the third interlayer insulating patterns 16 and part of the second interlayer insulating patterns 12 are being removed, the spacers 26 may also be removed.

The fourth interlayer insulating patterns 12a may be formed on the top of the first interlayer insulating layer 10 and both side walls of lower portions of the cylindrical structures 28 to have a certain thickness. Due to the fourth interlayer insulating patterns 12a, both side walls of the cylindrical structures 28 below the supporters 14 may be exposed through the fourth holes 27b. Both side walls of the cylindrical structures 28 above the supporters 14 may also be exposed through the fourth holes 27b.

Referring to FIG. 17, the cylindrical structures 28a having recesses are formed by further inwardly etching the both side walls of the cylindrical structures 28 exposed through the fourth holes 27b. The cylindrical structures 28a having recesses are formed by further inwardly etching both side walls of the cylindrical structures 28 by the first through third thicknesses RS1, RS2, and RS3.

Recess etching, in which the both side walls of the cylindrical structures 28 are recessed inward, may be performed by an etching apparatus using a supercritical fluid, e.g., supercritical carbon dioxide ($CO_2$). A supercritical fluid refers to any fluid above a certain temperature and pressure referred to as a critical point, where distinct liquid and gas phases do not exist. In the case of carbon dioxide, critical conditions may include a critical temperature of 31.7 □ C and a critical pressure of 72.8 atm. Because a supercritical fluid does not have surface tension like gas in terms of diffusion force and is similar to a liquid solvent in terms of resolving capability, the cylindrical structures 28 that are thin may be recessively etched by the supercritical fluid.

Continuously, fifth holes 27c are formed by removing the fourth interlayer insulating patterns 12a. The fifth holes 27c may correspond to the opening region in FIG. 1. The fourth interlayer insulating patterns 12a may be removed by wet etching.

As a result, the cylindrical structures 28a having recesses may include the lower level electrode portion LV1-1, the upper level electrode portion LV1-2, the second level electrode portion LV2, and the third level electrode portion LV3-1, as described above. The side profile of the cylindrical structures 28a having recesses has been described above, and thus descriptions thereof will be omitted.

Described below are embodiments in which a capacitor including the cylindrical structures 28 in FIGS. 1 through 3, e.g., cylindrical lower electrodes, is applied to a cell transistor of a DRAM device.

Figure 18:
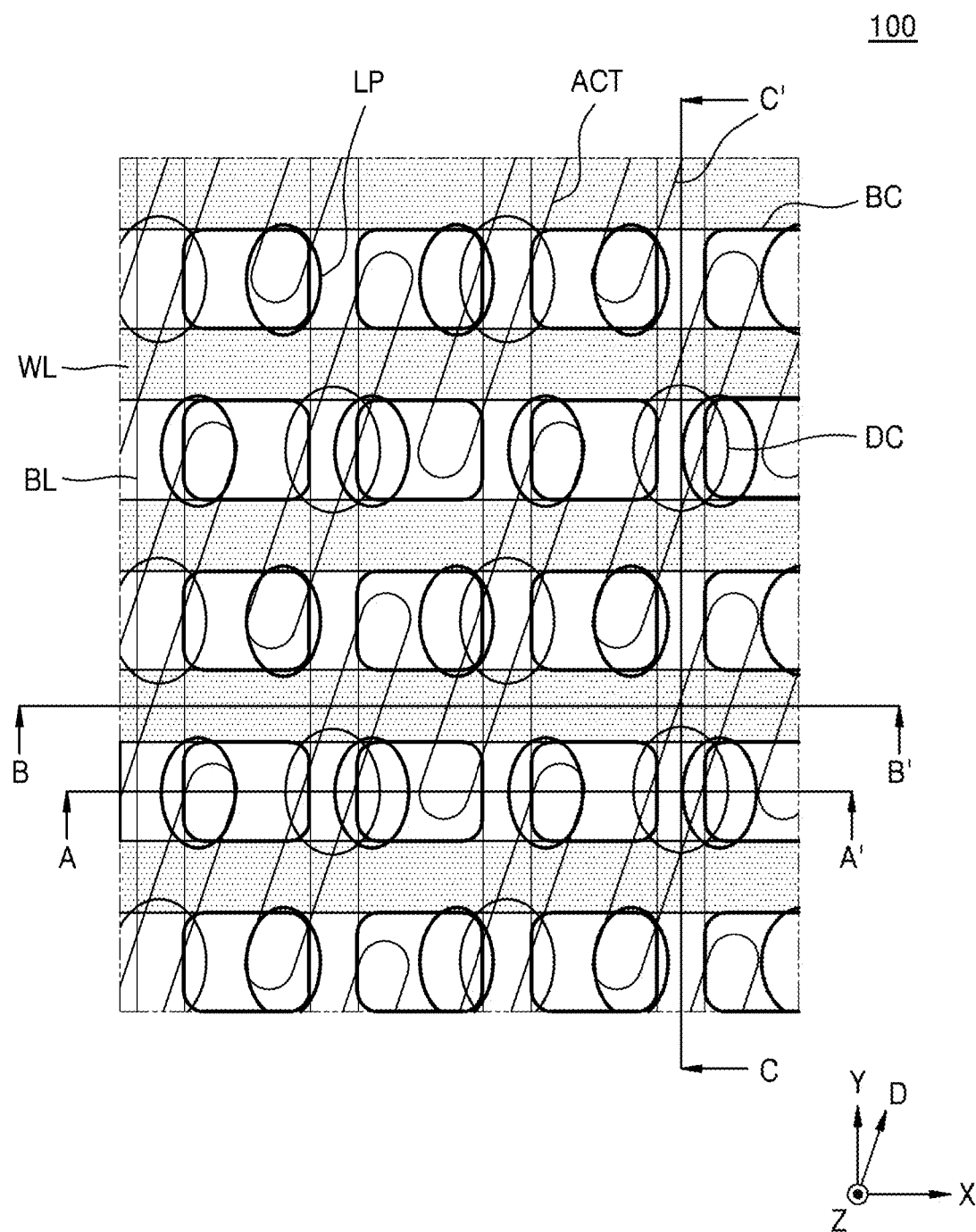
FIG. 18 is a schematic layout plan for describing main elements in a cell array area of a dynamic random access memory (DRAM) device, according to example embodiments.

FIG. 18 is a schematic layout plan for describing main elements in a cell array area of a DRAM device, according to example embodiments.

For example, a DRAM device 100 may include a plurality of active regions ACT. In some embodiments, the active regions ACT may be arranged to have a long axis in a diagonal direction to the first direction (e.g., the X direction) and the second direction (e.g., the Y direction).

A plurality of word lines WL may extend in the first direction (e.g., the X direction) crossing the active regions ACT to be parallel with one another. A plurality of bit lines BL may extend over the word lines WL in the second direction (e.g., the Y direction) crossing the first direction (e.g., the X direction) to be parallel with one another.

The bit lines BL may be connected to the active regions ACT through a direct contact DC. In some embodiments, a plurality of buried contacts BC may be formed between two adjacent bit lines BL among the bit lines BL. Each of the buried contacts BC may extend to above one of two bit lines BL adjacent thereto. In some embodiments, the buried contacts BC may be arranged in a line in the first direction (e.g., the X direction) and the second direction (e.g., the Y direction).

A plurality of landing pads LP may be formed above the buried contacts BC. The buried contacts BC and the landing pads LP may connect a lower electrode (not shown) of a capacitor formed above the bit lines BL to the active regions ACT. Each of the landing pads LP may partially overlap a buried contact BC.

FIGS. 19A through 19I are diagrams for describing a method of manufacturing a DRAM device, according to example embodiments. FIGS. 19A through 19I are cross-sectional views taken along line A-A', line B-B', and line C-C' in FIG. 18.

Figure 19A:
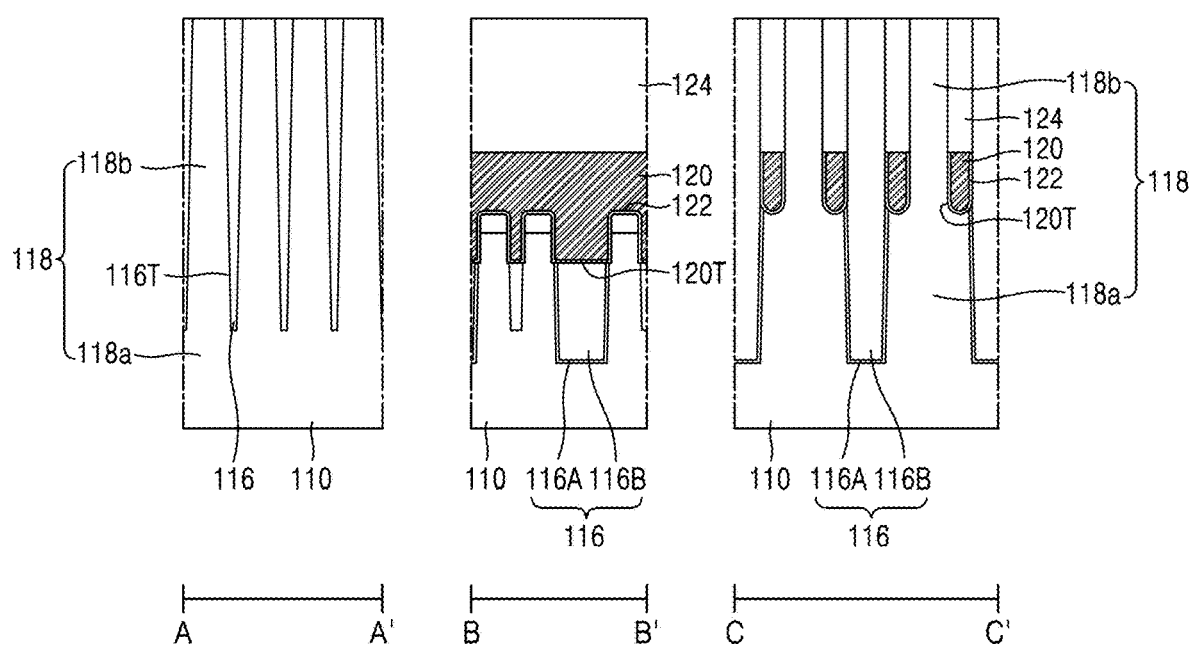
FIGS. 19A through 19I are diagrams for describing a method of manufacturing a DRAM device, according to example embodiments.

Referring to FIG. 19A, a device isolation trench 116T is formed in a substrate 110. A device isolation layer 116 may be formed in the device isolation trench 116T. An active region 118 may be defined by the device isolation layer 116 in the substrate 110. The active region 118 may be divided into a first active region 118a on the substrate 110 and a second active region 118b on the first active region 118a. Like the active region ACT in FIG. 18, the active regions 118 may have a relatively long island shape having a short axis and a long axis.

The substrate 110 may correspond to the substrate Sb described above. The substrate 110 may include a conductive region, e.g., an impurity-doped well or an impurity-doped structure.

For example, the device isolation layer 116 may include a material including at least one selected from a silicon oxide film, a silicon nitride film, and a silicon oxynitride film. The device isolation layer 116 may include a single film including one kind of insulating films, a double film including two kinds of insulating films, or multiple films including a combination of at least three kinds of insulating films.

In some embodiments, the device isolation layer 116 may include a first device isolation layer 116A and a second device isolation layer 116B. The first device isolation layer 116A may include a different material than the second device isolation layer 116B. For example, the first device isolation layer 116A may include a silicon oxide film and the second device isolation layer 116B may include a silicon nitride film. However, the configuration of the device isolation layer 116 is not limited to the descriptions above.

A plurality of word line trenches 120T may be formed in the second active region 118b. The word line trenches 120T may extend in the first direction (e.g., the X direction in FIG. 18) to be parallel with each other and may have a line shape crossing the active region 118. As shown in the cross-sectional view taken along line B-B', to form the word line trenches 120T having steps in the bottoms thereof, the device isolation layer 116 and the second active region 118b may be respectively etched by separate etching processes such that the etching depth of the device isolation layer 116 is different from the etching depth of the second active region 118b.

After a resultant structure including the word line trenches 120T is cleaned, a gate dielectric layer 122, a plurality of word lines 120, and a plurality of buried insulating layers 124 may be sequentially formed in the word line trenches 120T. The word lines 120 may form the word lines WL in FIG. 18.

The top surfaces of the word lines 120 may be at a lower level than the top surface of the second active region 118. The bottom surfaces of the word lines 120 may have a rugged shape, and a transistor having a saddle fin structure, e.g., a saddle fin field effect transistor (FinFET), may be formed in the active regions 118.

As described above, the term "level" refers to a height from the main surface of the substrate 110 in the vertical direction. In some embodiments, after the word lines 120 are formed, impurity ions may be implanted into second active regions 118b respectively at both sides of each of the word lines 120, thereby forming a source region and a drain region in the active regions 118. In some embodiments, before the word lines 120 are formed, a process of implanting impurity ions to form source and drain regions may be performed. In some embodiments, the word lines 120 may include Ti, TiN, Ta, TaN, W, WN, TiSiN, WSiN, or a combination thereof.

The gate dielectric layer 122 may include at least one selected from a silicon oxide film, a silicon nitride film, a silicon oxynitride film, oxide/nitride/oxide (ONO), and a high-k dielectric film having a higher dielectric constant than the silicon oxide film. For example, the gate dielectric layer 122 may have a dielectric constant of about 10 to about 25. In some embodiments, the gate dielectric layer 122 may include a metal dielectric film, e.g., at least one material selected from hafnium oxide (HfO), hafnium silicate (HfSiO), hafnium oxynitride (HfON), hafnium silicon oxynitride (HfSiON), lanthanum oxide (LaO), lanthanum aluminum oxide (LaAlO), zirconium oxide (ZrO), zirconium silicate (ZrSiO), zirconium oxynitride (ZrON), zirconium silicon oxynitride (ZrSiON), tantalum oxide (TaO), titanium oxide (TiO), barium strontium titanium oxide (BaSrTiO), barium titanium oxide (BaTiO), strontium titanium oxide (SrTiO), yttrium oxide (YO), aluminum oxide (AlO), and lead scandium tantalum oxide (PbScTaO).

The top surfaces of the buried insulating layers 124 may be at the same or substantially the same level as the top surface of the second active region 118b. The buried insulating layers 124 may include a material film selected from a silicon oxide film, a silicon nitride film, a silicon oxynitride film, and a combination thereof.

Figure 19B:
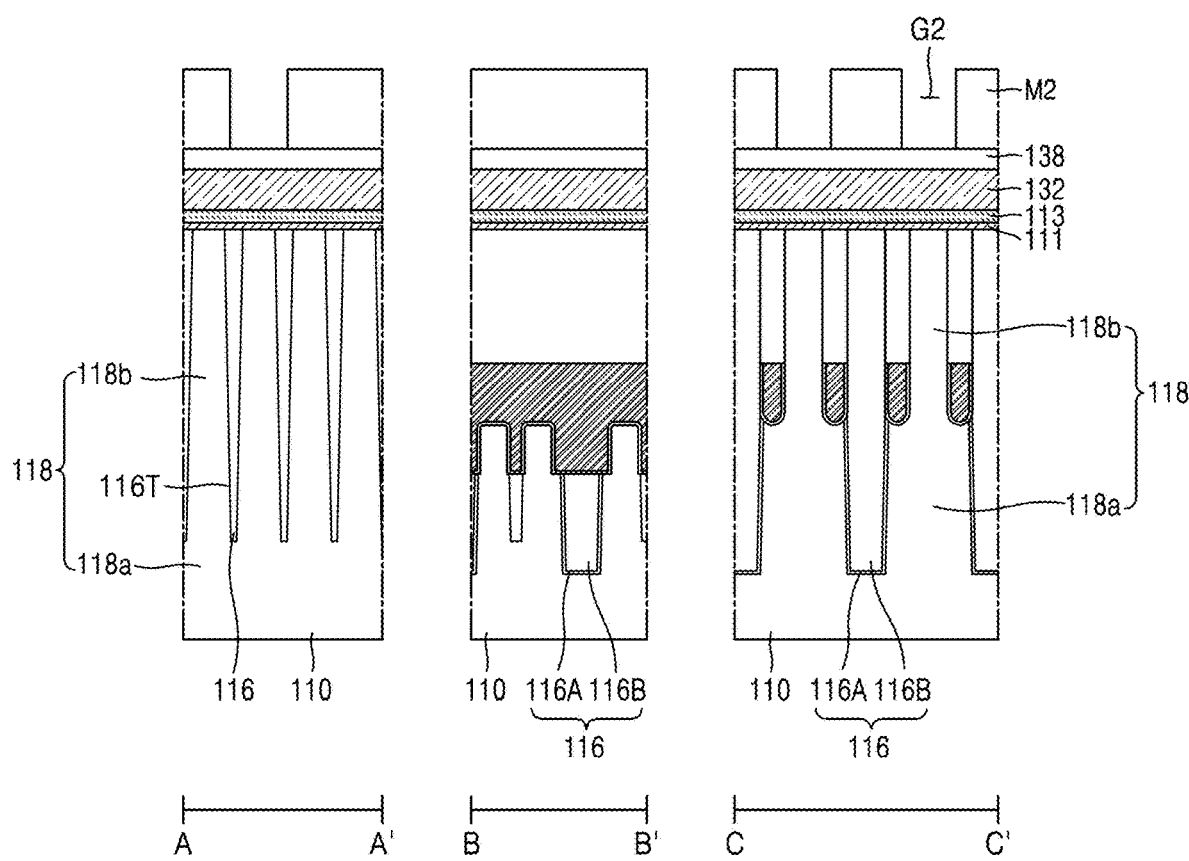

Referring to FIG. 19B, a first insulating layer 111 and a second insulating layer 113 are formed on the device isolation layer 116, the second active region 118b, and the buried insulating layers 124. The first insulating layer 111 may include a nonmetal dielectric film. For example, the first insulating layer 111 may include a silicon oxide film, a silicon nitride film, a silicon oxynitride film, or a combination thereof. The second insulating layer 113 may include a metal dielectric film. The second insulating layer 113 may have a higher permittivity than the first insulating layer 111. For example, the second insulating layer 113 may include at least one material selected from metal dielectric films included in the gate dielectric layer 122, which have been described above.

Subsequently, a first conductive layer 132 is formed on the second insulating layer 113. The first conductive layer 132 may include, for example, a doped semiconductor material. In some embodiments, the first conductive layer 132 may include a doped polysilicon film. A hard mask layer 138 is formed on the first conductive layer 132. Thereafter, a second photoresist pattern M2 is formed on the hard mask layer 138.

The hard mask layer 138 may include a material having a sufficient etch selectivity with respect to the first conductive layer 132 but is not specifically limited. For example, the hard mask layer 138 may include a carbon-based material.

The second photoresist pattern M2 is formed by depositing photoresist on the hard mask layer 138 and patterning the photoresist using exposure and development. At this time, the second photoresist pattern M2 may have an opening G2 that partially exposes the hard mask layer 138.

Figure 19C:
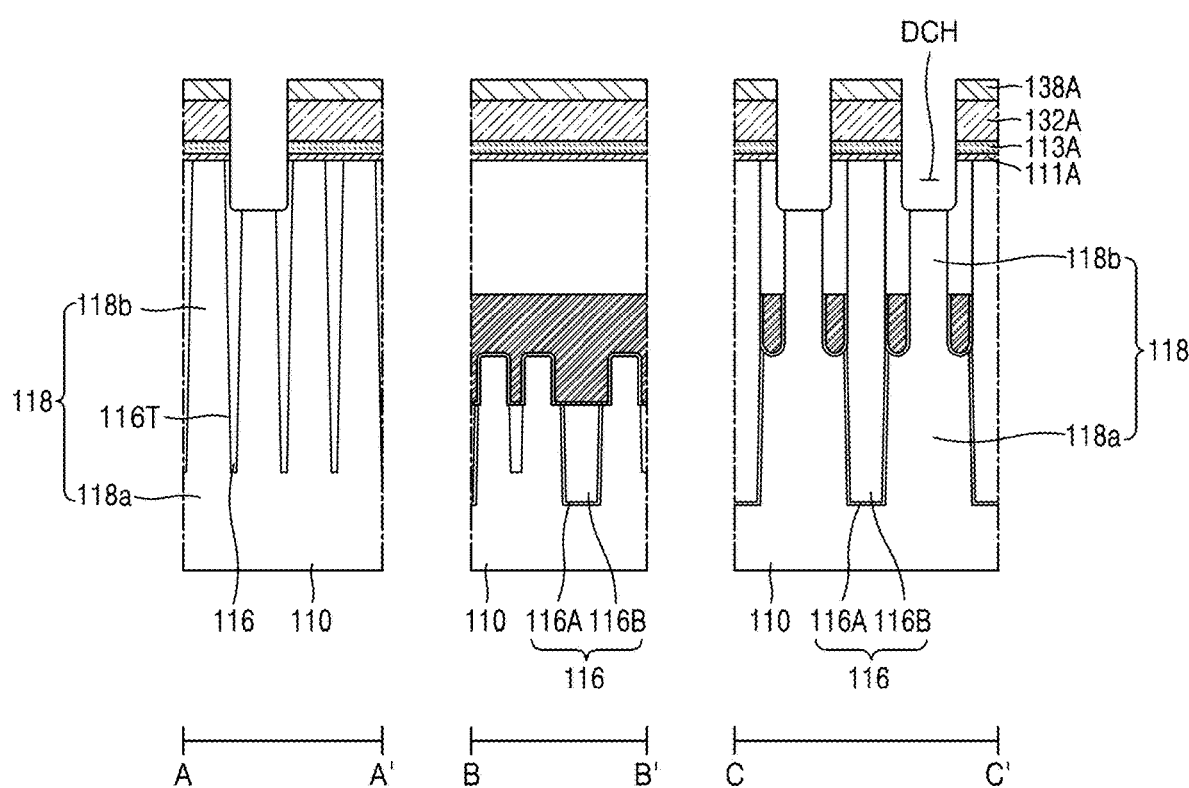

Referring to FIG. 19C, a hard mask pattern 138A is formed by etching a portion of the hard mask layer 138 in FIG. 19B, which is exposed through the opening G2 in FIG. 19B of the second photoresist pattern M2 of FIG. 19B. Thereafter, the first conductive layer 132 (in FIG. 19B), the second insulating layer 113 (in FIG. 19B), the first insulating layer 111 (in FIG. 19B), and an upper portion of the second active region 118b (in FIG. 19B) are etched using the hard mask pattern 138A as an etch mask.

As a result, a direct contact hole DCH exposing the second active region 118b is formed. In addition, a first conductive pattern 132A, a second insulating pattern 113A, and a first insulating pattern 111A, which define the direct contact hole DCH, are formed. In some embodiments, the level of the bottom surface of the direct contact hole DCH may be lower than the level of the top surface of the second active region 118b.

Figure 19D:
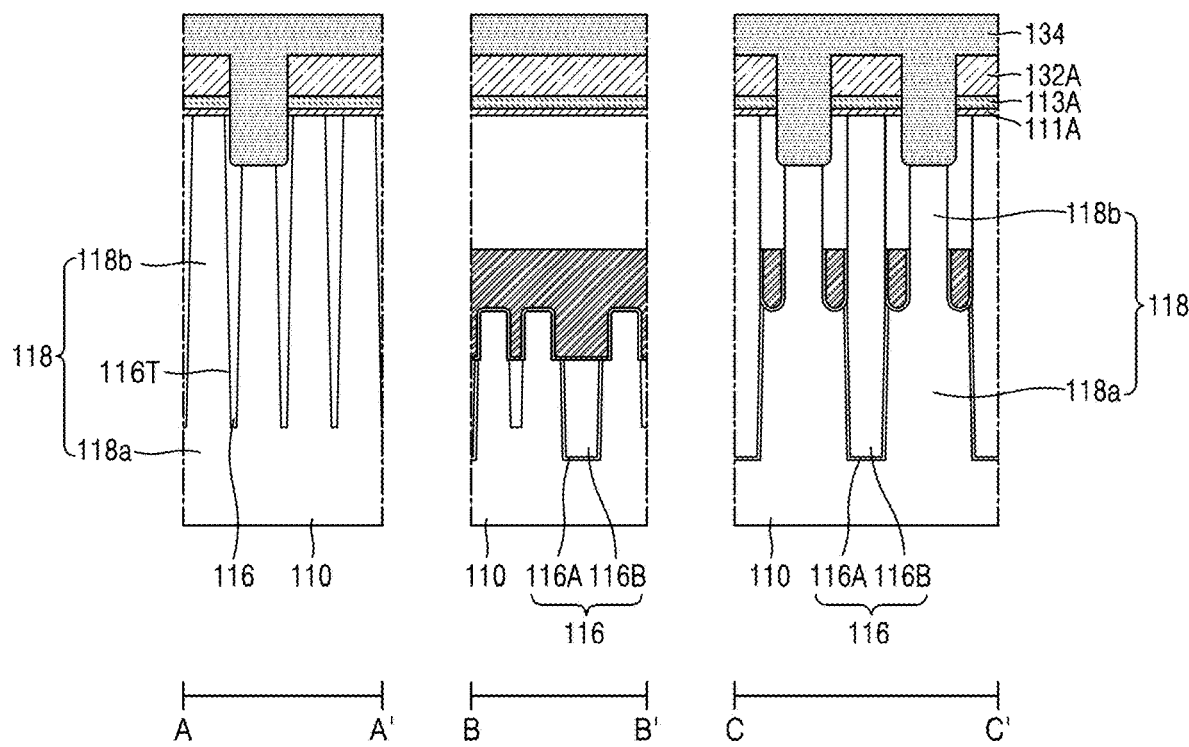

Referring to FIG. 19D, the hard mask pattern 138A in FIG. 19C is removed. The hard mask pattern 138A may be removed using ashing and strip processes. In addition, the hard mask pattern 138A may be removed under conditions in which etching of the first conductive pattern 132A is suppressed.

In some embodiments, after the hard mask pattern 138A is removed, silicon treatment may be performed. Silicon treatment is a process of weakly etching or cleaning the surface of the second active region 118b or the like, which has been damaged during the etching process described with reference to FIG. 19C, thereby providing a high-quality surface state. Thereafter, a cleaning process may be performed to remove native oxide and other pollutants.

Continuously, a second conductive layer 134, which completely fills the direct contact hole DCH (in FIG. 19C) and covers the top surface of the first conductive pattern 132A, is formed. The second conductive layer 134 may include, for example, a doped semiconductor material. In some embodiments, the second conductive layer 134 may include doped polysilicon.

In other words, both the second conductive layer 134 and the first conductive layer 132 (in FIG. 19B) may include a doped semiconductor material, e.g., a doped polysilicon film. In addition, the second conductive layer 134 may have a higher doping concentration than the first conductive layer 132. However, the configurations of the first conductive layer 132 and the second conductive layer 134 are not limited to the descriptions above.

Figure 19E:
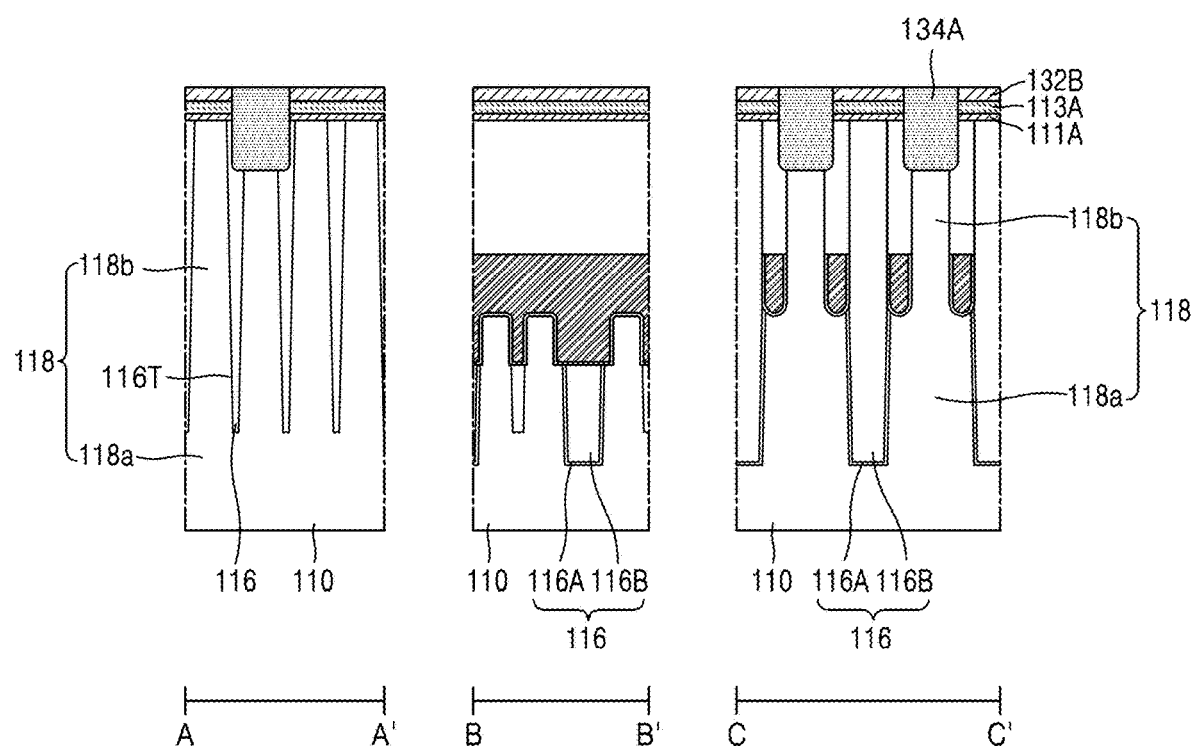

Referring to FIG. 19E, a direct contact 134A and a thinned first conductive pattern 132B are formed by blanket-etching the second conductive layer 134 (of FIG. 19D) and the first conductive pattern 132A (of FIG. 19D). A blanket-etching process may be performed using an etch-back method or a chemical-mechanical polishing (CMP) method. An upper portion of the first conductive pattern 132A is removed by the blanket-etching process such that the thinned first conductive pattern 132B that is thinner than the first conductive pattern 132A may be formed.

The top surfaces of the direct contact 134A and the thinned first conductive pattern 132B may be exposed, and the top surface of the direct contact 134A may be at the same level as the top surface of the thinned first conductive pattern 132B. Both sides of the direct contact 134A may be in contact with the thinned first conductive pattern 132B with an interface therebetween. However, the configurations of the direct contact 134A and the thinned first conductive pattern 132B are not limited to the descriptions above.

Figure 19F:
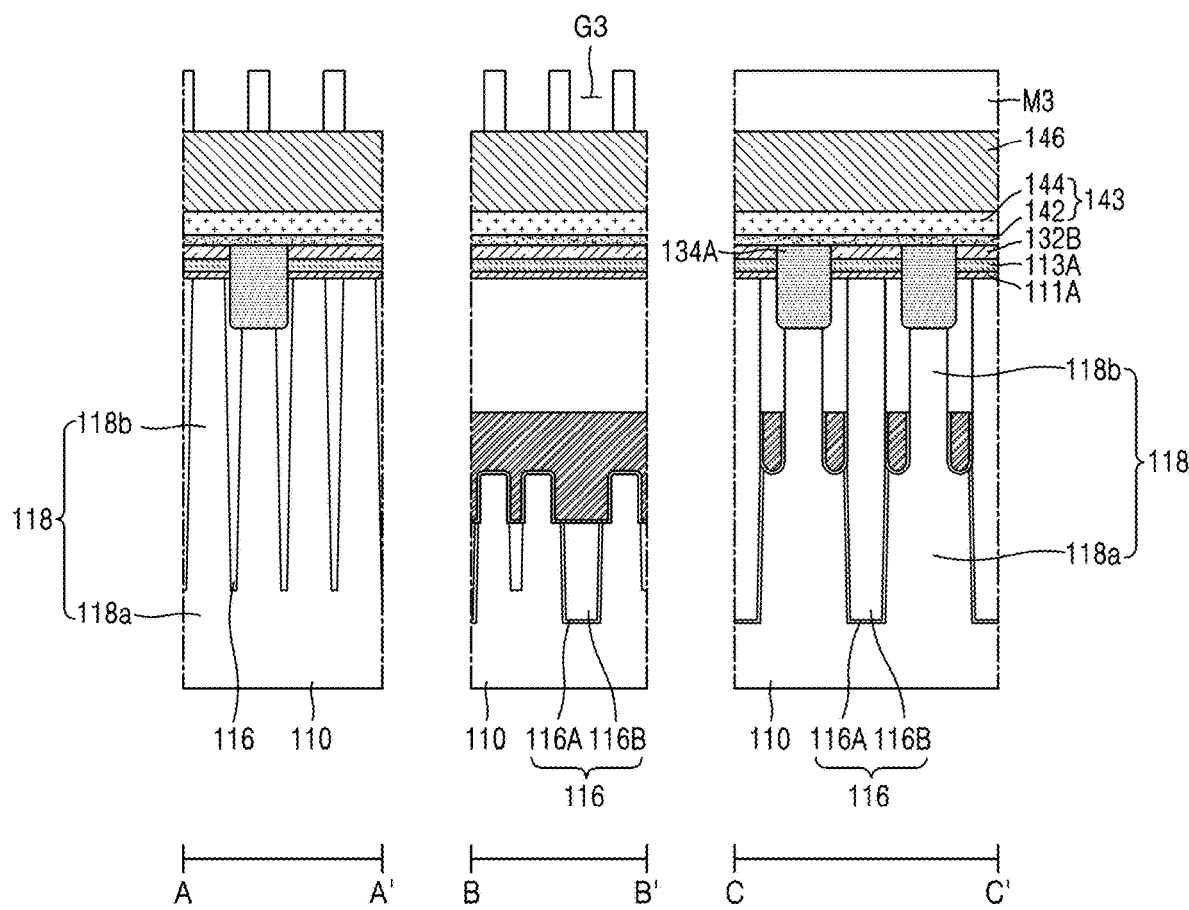

Referring to FIG. 19F, a metal layer 143 covering the direct contact 134A and the thinned first conductive pattern 132B is formed. Thereafter, an insulating capping layer 146 is formed on the metal layer 143. In some embodiments, the metal layer 143 may have a stack structure in which a lower metal layer 142 and an upper metal layer 144 are stacked. Although it is illustrated that the metal layer 143 has a double-layer conductive stack structure including the lower metal layer 142 and the upper metal layer 144, this is just an example and embodiments are not limited thereto. For example, the metal layer 143 may include a single layer or a stack structure including at least three layers.

In some embodiments, the lower metal layer 142 may include a TiN or Ti—Si—N (TSN). The upper metal layer 144 may include tungsten (W) or tungsten silicide ($WSi_x$). In some embodiments, the lower metal layer 142 may function as a diffusion barrier.

The insulating capping layer 146 may be formed on the metal layer 143. The insulating capping layer 146 may include, for example, a silicon nitride film. In some embodiments, the insulating capping layer 146 may be thicker than the metal layer 143.

Continuously, a third photoresist pattern M3 is formed on the insulating capping layer 146. The third photoresist pattern M3 is formed by depositing photoresist on the insulating capping layer 146 and patterning the photoresist using exposure and development. At this time, the third photoresist pattern M3 may have an opening G3 that partially exposes the insulating capping layer 146.

Figure 19G:
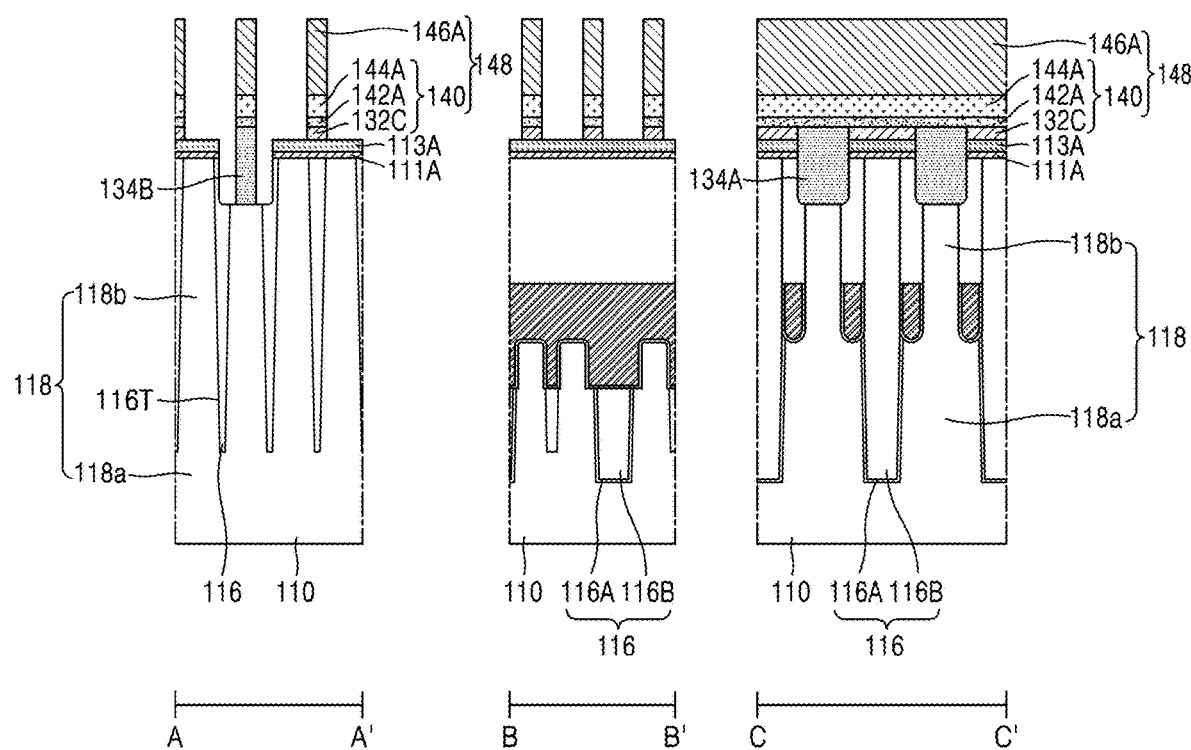

Referring to FIG. 19G, a bit line structure 148 is formed on the second active region 118b. For example, the thinned first conductive pattern 132B (in FIG. 19F), the lower metal layer 142 (in FIG. 19F), the upper metal layer 144 (in FIG. 19F), and the insulating capping layer 146 (in FIG. 19F) are etched using the third photoresist pattern M3 (in FIG. 19F) as an etch mask. As a result, a plurality of bit lines 140 each including a thinned first conductive line 132C having a line shape, a lower metal line 142A, and an upper metal line 144A are formed. Thereafter, a plurality of insulating capping lines 146A are respectively formed on the bit lines 140. One bit line 140 and one insulating capping line 146A may form one bit line structure 148.

The bit lines 140 and the insulating capping lines 146A may extend in the second direction (e.g., the Y direction in FIG. 16) to be parallel with each other. The bit lines 140 may form the bit lines BL illustrated in FIG. 16.

During an etching process of forming the bit lines 140, a portion of the direct contact 134A, which does not overlap the bit lines 140 in a vertical direction with respect to the main surface of the substrate 110, may also be etched, thereby forming a direct contact conductive pattern 134B. In some embodiments, the top surface of the direct contact conductive pattern 134B may be at a higher level than the top surface of the third insulating pattern 113A.

While the bit lines 140 include the thinned first conductive line 132C which includes doped polysilicon, the bit lines 140 may have a vertical stack structure that is not relatively thick.

Figure 19H:
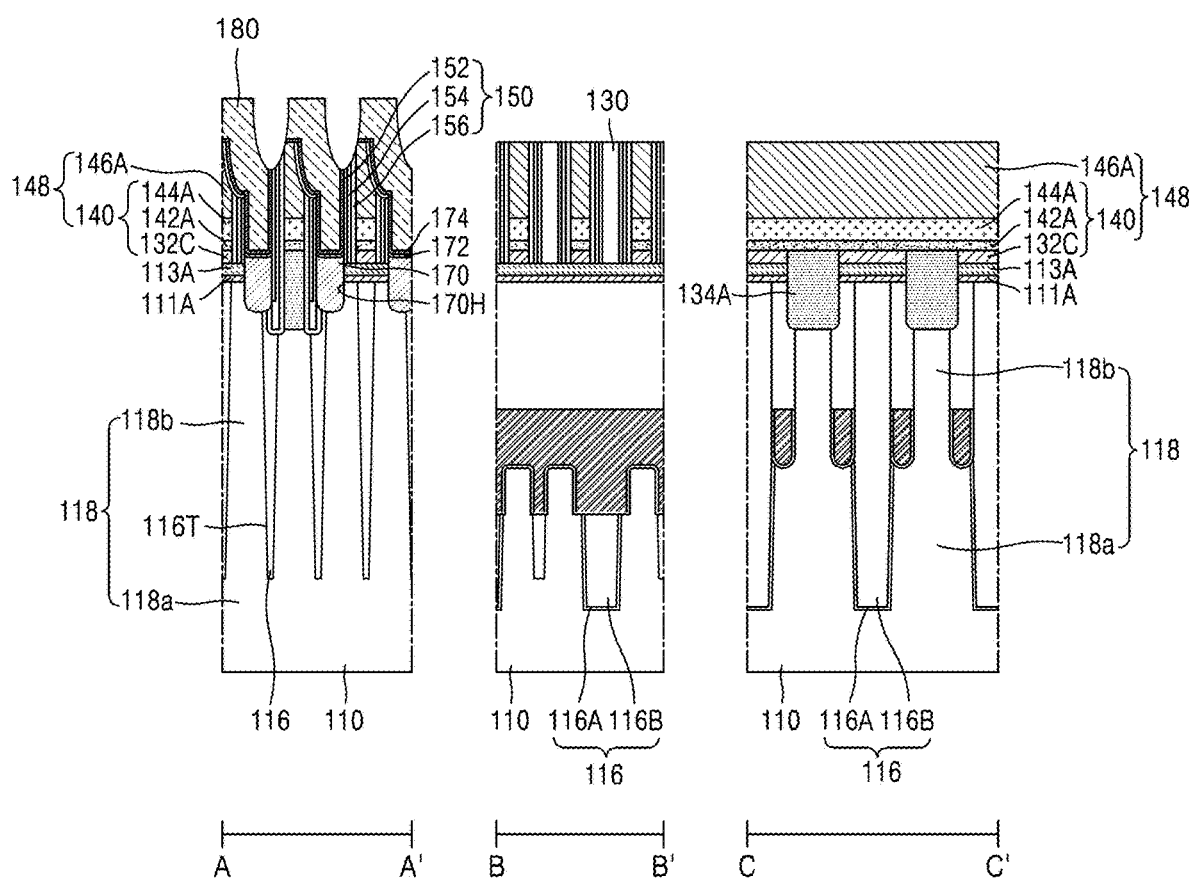

Referring to FIG. 19H, the DRAM device 100 including a plurality of bit line structures 148 may be formed. For example, both side walls of each of the bit line structures 148 may be covered with an insulating spacer structure 150. The insulating spacer structure 150 may include a first insulating spacer 152, a second insulating spacer 154, and a third insulating spacer 156.

In some embodiments, the first insulating spacer 152, the second insulating spacer 154, and the third insulating spacer 156 may include a silicon oxide film, a silicon nitride film, a silicon oxynitride film, or a combination thereof. In some embodiments, the first insulating spacer 152 and the third insulating spacer 156 may include a silicon oxide film, a silicon nitride film, a silicon oxynitride film, or a combination thereof, and the second insulating spacer 154 between the first insulating spacer 152 and the third insulating spacer 156 may include an air spacer.

A plurality of buried contact holes 170H may be formed among the bit lines 140. The inner space of each of the buried contact holes 170H may be defined by the active region 118 and the insulating spacer structure 150, which is between two adjacent bit lines 140 among the bit lines 140 and covers the side wall of each of the two adjacent bit lines 140.

A plurality of buried contacts 170, which are respectively connected to a plurality of active regions 118, and a plurality of landing pads 180 may be formed in the buried contact holes 170H among the bit lines 140. The buried contacts 170 and the landing pads 180 may respectively correspond to the buried contacts BC and the landing pads LP in FIG. 18.

The buried contacts 170 may respectively extend from the active regions 118 in the third direction (e.g., the Z direction in FIG. 18) perpendicular to the substrate 110. The landing pads 180 are respectively on the buried contacts 170 and may extend over the bit lines 140. The landing pads 180 may be connected to the cell active regions through the buried contacts 170.

The landing pads 180 may be electrically connected to the buried contacts 170 and may extend from inside the buried contact holes 170H to above the bit line structures 148 and thus vertically overlap the bit line structures 148.

The landing pads 180 may extend in a region among the bit lines in the third direction (e.g., the Z direction in FIG. 18) perpendicular to the main surface of the substrate 110 and may cover at least a portion of the top surfaces of the bit lines 140 such that the landing pads 180 vertically overlap at least portions of the bit lines 140.

A metal silicide layer 172 may be formed between a buried contact 170 and a landing pad 180. The metal silicide layer 172 may include cobalt silicide (CoSi), nickel silicide (NiSi), or manganese silicide (MnSi). but is not limited thereto.

A conductive barrier layer 174 may be formed between a landing pad 180 and an insulating spacer structure 150 and between the landing pad 180 and a bit line structure 148. The conductive barrier layer 174 may include metal, conductive metal nitride, or a combination thereof. For example, the conductive barrier layer 174 may have a Ti/TiN stack structure.

An insulating layer 130 may be formed around the bit line structure 148 and the insulating spacer structure 150. The insulating layer 130 may include a silicon oxide film, a silicon nitride film, a silicon oxynitride film, or a combination thereof.

The landing pad 180 may be formed using chemical vapor deposition (CVD) or physical vapor deposition (PVD). In some embodiments, the landing pad 180 may include metal, metal nitride, conductive polysilicon, or a combination thereof. For example, the landing pad 180 may include tungsten (W).

Figure 19I:
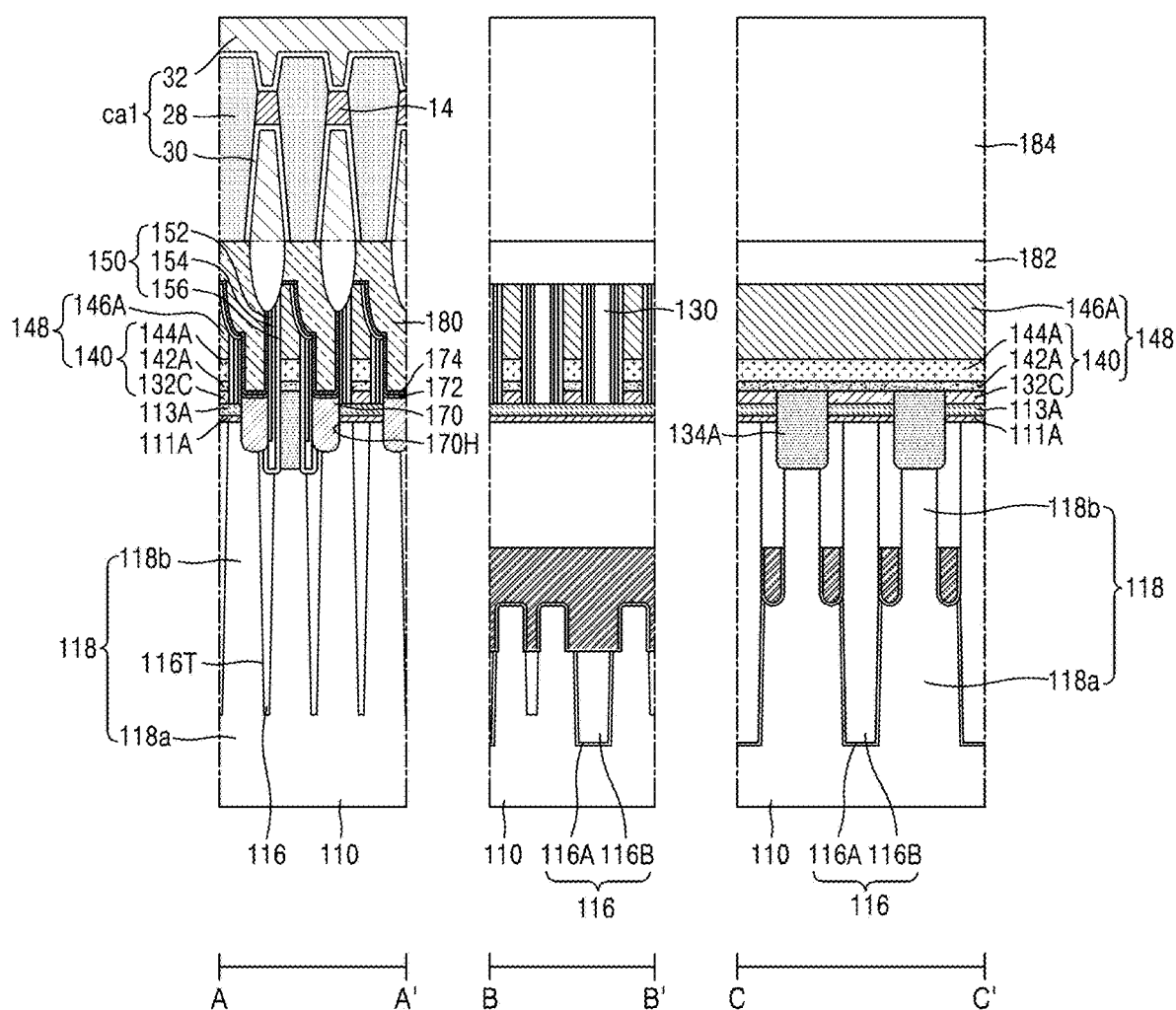

Referring to FIG. 19I, the DRAM device 100 including the capacitor ca1 in FIGS. 1 through 3 may be formed on landing pads 180. The capacitor ca1 includes the cylindrical structures 28 in FIGS. 1 through 3 as cylindrical lower electrodes. The capacitor ca1 may be completed by forming the dielectric layer 30 and the upper electrode 32 on the cylindrical structures 28. The dielectric layer 30 and the upper electrode 32 may include the material described above. When the capacitor ca1 is formed, insulating layers 182 and 184 may be formed at the same level as the capacitor ca1 in other cross-sections.

While the inventive concepts have been particularly shown and described with reference to embodiments thereof, it will be understood that various changes in form and details may be made therein without departing from the spirit and scope of the following claims.

What is claimed is:

1. An integrated circuit semiconductor device comprising:
   a plurality of cylindrical structures separated from each other on a substrate; and
   a plurality of supporters having an opening region exposing side surfaces of the plurality of cylindrical structures, the plurality of supporters being in contact with the side surfaces of the plurality of cylindrical structures and supporting the plurality of cylindrical structures,
   wherein side surfaces of each of the plurality of supporters have slopes and a top width that is less than a bottom width, and
   the side surfaces of the plurality of cylindrical structures have a first slope adjacent the plurality of supporters, the first slope transitioning to a second slope at a top surface of the plurality of supporters.

2. The integrated circuit semiconductor device of claim 1, wherein the plurality of supporters are at a height that is lower than top surfaces of the plurality of cylindrical structures.

3. The integrated circuit semiconductor device of claim 2, wherein each of the plurality of cylindrical structures higher than the plurality of supporters has both side surfaces having slopes and has a top width that is less than a bottom width.

4. The integrated circuit semiconductor device of claim 2, wherein a top space between the plurality of cylindrical structures higher than the plurality of supporters is greater than a bottom space therebetween.

5. The integrated circuit semiconductor device of claim 2, wherein each of the plurality of cylindrical structures at the same level as the plurality of supporters has both side surfaces having slopes and has a top width that is greater than a bottom width.

6. The integrated circuit semiconductor device of claim 2, wherein each of the plurality of cylindrical structures lower than the plurality of supporters has both side surfaces having slopes and has a top width that is greater than a bottom width.

7. The integrated circuit semiconductor device of claim 1, further comprising additional supporters below the plurality of supporters, the additional supporters being in contact with the side surfaces of the plurality of cylindrical structures and supporting the plurality of cylindrical structures.

8. The integrated circuit semiconductor device of claim 1, wherein the plurality of supporters are at a height that is lower than top surfaces of the plurality of cylindrical structures, and
each of the plurality of cylindrical structures higher than the plurality of supporters has both side surfaces having slopes and recessed inward and has a top width that is less than a bottom width.

9. The integrated circuit semiconductor device of claim 1, wherein the plurality of supporters are at a height that is lower than top surfaces of the plurality of cylindrical structures, and
each of the plurality of cylindrical structures lower than the plurality of supporters has both side surfaces having slopes and recessed inward and has a top width that is greater than a bottom width.

10. The integrated circuit semiconductor device of claim 1, wherein the plurality of cylindrical structures include cylindrical lower electrodes having a seam therein, a dielectric film is between the cylindrical lower electrodes and on side surfaces of the cylindrical lower electrodes, and an upper electrode is on the dielectric film.

11. An integrated circuit semiconductor device comprising:
a plurality of cylindrical structures separated from each other on a substrate; and
a plurality of supporters having an opening region exposing side surfaces of the plurality of cylindrical structures, the plurality of supporters being in contact with the side surfaces of the plurality of cylindrical structures, being at a height that is lower than top surfaces of the plurality of cylindrical structures, and supporting the plurality of cylindrical structures,
wherein the plurality of cylindrical structures include a first level electrode portion, a second level electrode portion, and a third level electrode portion, the first level electrode portion having a first height from the substrate, the second level electrode portion having a second height from a top of the first level electrode portion, and the third level electrode portion having a third height from a top of the second level electrode portion,
each of the first level electrode portion and the second level electrode portion has both side surfaces having slopes and has a top width that is greater than a bottom width, and the third level electrode portion has both side surfaces having slopes and has a top width that is less than a bottom width, and
a side surface of the first level electrode portion and a side surface of the second level electrode portion are connected to a side surface of the third level electrode portion, and a slope of the side surfaces of the first and second level electrode portions is opposite a slope of the side surface of the third level electrode portion in positive and negative perspectives, a top surface of the second level electrode portion being at a top surface of the plurality of supporters.

12. The integrated circuit semiconductor device of claim 11, wherein each of the plurality of supporters is at the side surface of the second level electrode portion.

13. The integrated circuit semiconductor device of claim 11, wherein each of the plurality of supporters has both side surfaces having slopes and has a top width that is less than a bottom width.

14. The integrated circuit semiconductor device of claim 11, wherein the first height of the first level electrode portion is greater than the second height of the second level electrode portion and the third height of the third level electrode portion, and
additional supporters are formed in a side wall of the first level electrode portion.

15. The integrated circuit semiconductor device of claim 11, wherein the first level electrode portion includes a lower level electrode portion on a top of the substrate and an upper level electrode portion on the lower level electrode portion,
both side walls of each of the plurality of cylindrical structures between the lower level electrode portion and the upper level electrode portion have slopes, and
a bottom width of the upper level electrode portion is less than a top width of the lower level electrode portion.

16. The integrated circuit semiconductor device of claim 11, wherein the first level electrode portion includes a lower level electrode portion on a top of the substrate and an upper level electrode portion on the lower level electrode portion, and
the bottom width of the second level electrode portion is greater than a top width of the upper level electrode portion.

17. The integrated circuit semiconductor device of claim 11, wherein the bottom width of the third level electrode portion is less than the top width of the second level electrode portion.

18. An integrated circuit semiconductor device comprising:
a plurality of cylindrical structures separated from each other on a substrate; and
a plurality of supporters having an opening region exposing side surfaces of the plurality of cylindrical structures, the plurality of supporters being in contact with the side surfaces of the plurality of cylindrical structures and supporting the plurality of cylindrical structures,
wherein the plurality of cylindrical structures include a first level electrode portion, a second level electrode portion, and a third level electrode portion, the first level electrode portion having a first height from the substrate, the second level electrode portion having a second height from a top of the first level electrode portion, and the third level electrode portion having a third height from a top of the second level electrode portion,
each of the first level electrode portion and the second level electrode portion has both side surfaces having slopes and has a top width that is greater than a bottom width, and the third level electrode portion has both side surfaces having slopes and has a top width that is less than a bottom width,
a side surface and an opposite side surface of each of the first level electrode portion and the second level electrode portion respectively have a positive slope and a negative slope, a side surface of the third level electrode portion connected to the side surface of each of the first and second level electrode portions has a negative slope, and an opposite side surface of the third level electrode portion connected to the opposite side surface of each of the first and second level electrode portions has a positive slope, each of the plurality of supporters is at the side surface of the second level electrode portion, has both side surfaces having slopes, and has a top width that is less than a bottom width, and a top surface of the second level electrode portion being at a top surface of the plurality of supporters.

19. The integrated circuit semiconductor device of claim 18, wherein the first level electrode portion includes a lower level electrode portion on a top of the substrate and an upper level electrode portion on the lower level electrode portion, the upper level electrode portion is recessed inward and has a bottom width that is less than a top width of the lower level electrode portion, both side walls of each of the plurality of cylindrical structures between the lower level electrode portion and the upper level electrode portion have slopes, and the bottom width of the second level electrode portion is greater than a top width of the upper level electrode portion.

20. The integrated circuit semiconductor device of claim 18, wherein the third level electrode portion is recessed inward, and the bottom width of the third level electrode portion is less than the top width of the second level electrode portion.

* * * * *